(12) United States Patent
Lu

(10) Patent No.: US 10,658,298 B1
(45) Date of Patent: May 19, 2020

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/179,181

(22) Filed: Nov. 2, 2018

(51) Int. Cl.
*H01L 23/532* (2006.01)
*H01L 23/00* (2006.01)
*H01L 25/065* (2006.01)
*H01L 21/56* (2006.01)
*H01L 23/31* (2006.01)

(52) U.S. Cl.
CPC ........ *H01L 23/5329* (2013.01); *H01L 21/561* (2013.01); *H01L 21/566* (2013.01); *H01L 23/31* (2013.01); *H01L 24/09* (2013.01); *H01L 24/17* (2013.01); *H01L 24/95* (2013.01); *H01L 25/0655* (2013.01)

(58) Field of Classification Search
CPC ... H01L 23/5329; H01L 23/31; H01L 21/561; H01L 21/566; H01L 24/09; H01L 24/17; H01L 24/95; H01L 25/0655
USPC ........................................................ 257/678
See application file for complete search history.

(56) References Cited

U.S. PATENT DOCUMENTS

| | | | |
|---|---|---|---|
| 9,269,825 B2 * | 2/2016 | Yamade | H01L 29/7869 |
| 10,181,468 B2 * | 1/2019 | Xu | H01L 29/66553 |
| 2012/0230155 A1 | 9/2012 | Kawaguchi | |

* cited by examiner

*Primary Examiner* — Tu-Tu V Ho
(74) *Attorney, Agent, or Firm* — Foley & Lardner LLP

(57) ABSTRACT

A semiconductor device package includes a dielectric layer, a first conductive pattern and a first semiconductor device. The dielectric layer has a first surface, wherein a surface uniformity of the first surface is substantially equal to or less than 5%. The first conductive pattern is disposed on the first surface of the dielectric layer, wherein the first conductive pattern includes a first conductive trace, and a line width of the first conductive trace substantially ranges from about 0.5 µm and about 2 µm. The first semiconductor device is disposed on the first surface of the dielectric layer and electrically connected to the first conductive pattern.

20 Claims, 31 Drawing Sheets

SEMICONDUCTOR DEVICE PACKAGE AND METHOD FOR MANUFACTURING THE SAME

BACKGROUND

1. Technical Field

The present disclosure relates to a semiconductor device package and manufacturing method thereof, and more particularly, to a semiconductor device package including a conductive pattern with ultra-fine line width and spacing and manufacturing method thereof.

2. Description of the Related Art

Due to demand for high performance and high density semiconductor device packages, a semiconductor package is designed to have high density input and output (I/O) counts and a thinner thickness. The I/O counts of a comparative semiconductor device package, however, cannot be readily further increased for the yield of conductive pattern is low when the line width and spacing of the conductive pattern shrink.

SUMMARY

In some embodiments, a semiconductor device package includes a dielectric layer, a first conductive pattern and a first semiconductor device. The dielectric layer has a first surface, wherein a surface uniformity of the first surface is substantially equal to or less than 5%. The first conductive pattern is disposed on the first surface of the dielectric layer, wherein the first conductive pattern includes a first conductive trace, and a line width of the first conductive trace substantially ranges from about 0.5 µm and about 2 µm. The first semiconductor device is disposed on the first surface of the dielectric layer and electrically connected to the first conductive pattern.

In some embodiments, a semiconductor device package includes a dielectric layer, a first conductive pattern and a first semiconductor device. The dielectric layer has a first surface, wherein the dielectric layer includes a liquid-based dielectric material or a dry-film dielectric material, a thickness of the dielectric layer is substantially equal to or less than about 5 µm, and a surface uniformity of the first surface is substantially equal to or less than about 5%. The first conductive pattern is disposed on the first surface of the dielectric layer, wherein the first conductive pattern includes a first conductive trace, and a line width of the first conductive trace substantially ranges from about 0.5 µm and about 2 µm. The first semiconductor device is disposed on the first surface of the dielectric layer and electrically connected to the first conductive pattern.

In some embodiments, a method for manufacturing a semiconductor device package is provided. A first carrier is received in a processing chamber, wherein the processing chamber includes a gas flow control unit. A dielectric material is formed on the first carrier, and a gas flow is provided by the gas flow control unit to blow the dielectric material to form a dielectric layer having a surface with a surface uniformity substantially equal to or less than 5%, wherein the gas flow ranges from about 7.5 m/min to about 38 m/min. A first conductive pattern is formed on the surface of the dielectric layer, wherein the first conductive pattern includes a first conductive trace, and a line width of the first conductive trace substantially ranges from about 0.5 µm and about 2 µm.

BRIEF DESCRIPTION OF THE DRAWINGS

Aspects of some embodiments of the present disclosure are best understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
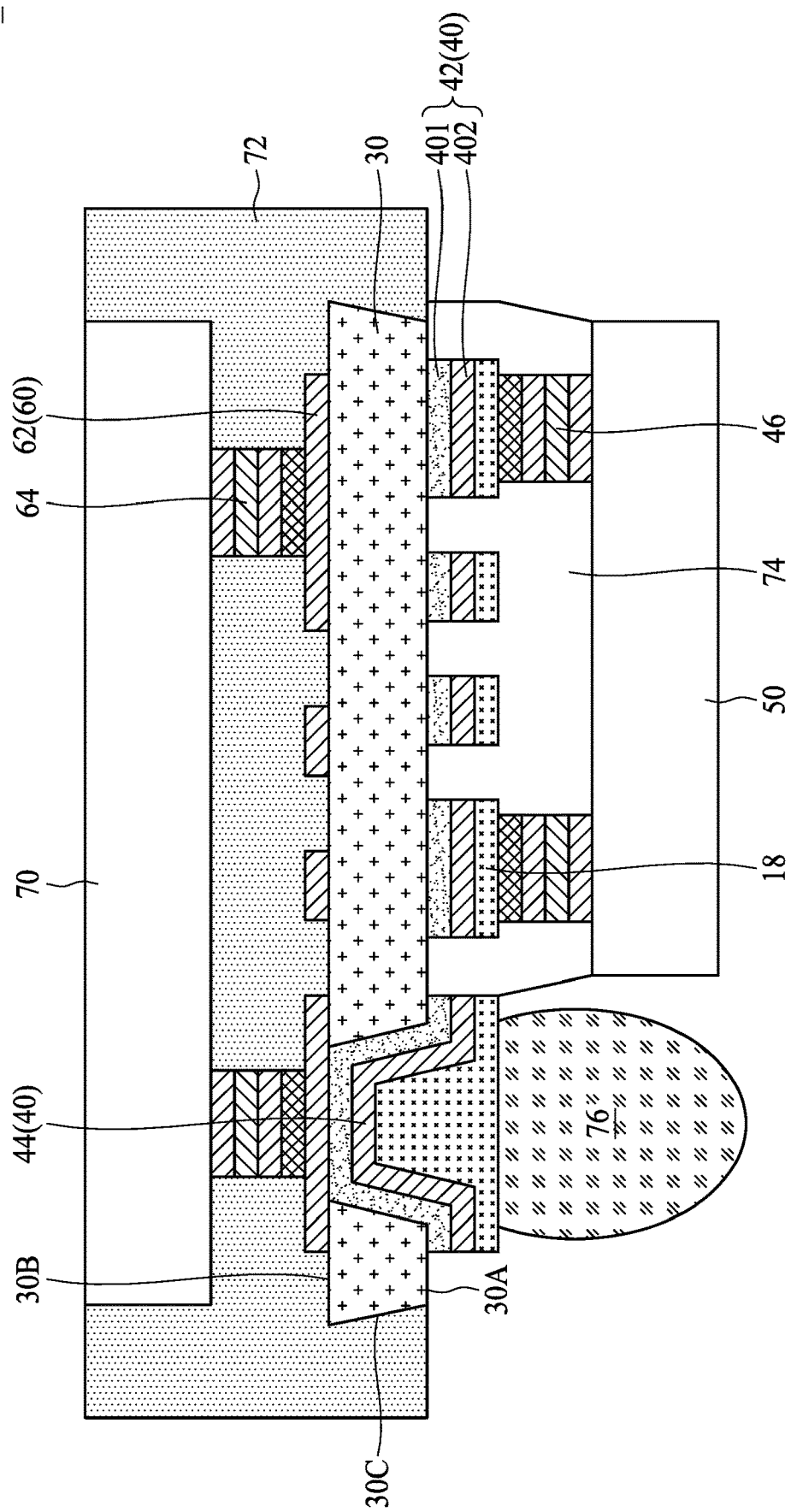
FIG. 1 is a cross-sectional view of a semiconductor device package in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that such arrangement does not deviate from the merits of the embodiments of this disclosure.

FIG. 1 is a cross-sectional view of a semiconductor device package 1 in accordance with some embodiments of the present disclosure. As shown in FIG. 1, the semiconductor device package 1 includes a dielectric layer 30, a conductive pattern 40 and one or more semiconductor devices 50. The dielectric layer 30 includes a first surface 30A, and a second surface 30B opposite to the first surface 30A. In some embodiments, the thickness of the dielectric layer 30 is substantially equal to or less than 5 micrometers (μm). In some embodiments, the surface uniformity of the first surface 30A is substantially equal to or less than 5%. In some embodiments, the surface uniformity is specified by a formula expressed below:

$$U(\%) = (T\max - T\min)/(2*T\text{mean}),$$

where U (%) represents a surface uniformity, Tmax represents a maximum thickness of the dielectric layer 30, Tmin represents a minimum thickness of the dielectric layer 30, and Tmean represents an average thickness of the dielectric layer 30.

In some embodiments, the dielectric layer 30 may include a liquid-based dielectric material or a dry-film dielectric material. The material of the dielectric layer 30 may include organic dielectric material such as bismaleimide triazine (BT), Ajinomoto Build-up Film (ABF), polyimide (PI), epoxy or the like. The dielectric layer 30 may be photosensitive, which can be solidified by optical curing. The dielectric layer 30 may, but is not limited to, be formed by a coating process such as spin coating or the like.

The conductive pattern 40 (which is also, but not limited to be, referred to as a first conductive pattern) is disposed on the first surface 30A of the dielectric layer 30. The conductive pattern 40 includes one or more conductive traces (also referred to as first conductive traces for example) 42 and one or more conductive pads 44. The conductive trace 42 may include ultra-fine line. For example, the line width of the conductive trace 42 substantially ranges from about 0.5 μm and about 2 μm, and the spacing of adjacent conductive traces 42 substantially ranges from about 0.5 μm and about 2 μm. In some embodiments, the line width of the conductive pad 44 may substantially ranges from about 0.5 μm and about 2 μm. In some other embodiments, the line width of the conductive pad 44 may be larger than 2 μm, for example larger than about 10 μm. The conductive pattern 40 may include a multi-layered structure. By way of example, the conductive pattern 40 may include a first conductive sub-layer 401 and a second conductive sub-layer 402 stacked on the first conductive sub-layer 401. In some embodiments, the first conductive sub-layer 401 may be configured as a seed layer, an adhesion layer or the like. The second conductive sub-layer 402 may be configured as conductive trace, conductive pad or the like. In some embodiments, the material of the first conductive sub-layer 401 includes titanium (Ti) or the like, and the material of the second conductive sub-layer 402 includes copper (Cu) or the like.

The semiconductor device (which is also, but not limited to be, referred to as a first semiconductor device) 50 is disposed on the first surface 30A of the dielectric layer 30 and electrically connected to the conductive pattern 40. In some embodiments, the semiconductor device 50 may be bonded to the conductive traces 42 through conductors 46 such as micro bumps or the like. The conductor 46 may be a multi-layered structure including a stack of multiple conductive materials. In some embodiments, an underfill 74 is disposed between the semiconductor device 50 and the first surface 30A of the dielectric layer 30, surrounding the conductive traces 42 and the conductors 46.

In some embodiments, the semiconductor device package 1 may further include one or more connection elements 76 disposed on the first surface 30A of the dielectric layer 30, and configured to build external electrical connection. The connection elements 76 may be disposed on the conductive pads 44. The connection elements 76 may include conductive balls such as solder balls, conductive bumps such as solder bumps, C4 (controlled collapse chip connection) bumps, conductive pillars or the like. The connection elements 76 may be selected and arranged to be applied in different types of packages such as ball grid array (BGA), land grid array (LGA) or the like.

The semiconductor device package 1 may further include another conductive pattern (which is also, but not limited to be, referred to as a second conductive pattern) 60 disposed on the second surface 30B of the dielectric layer 30, and electrically connected to the conductive pattern 40. The conductive pattern 60 includes one or more conductive traces (which are also, but not limited to be, referred to as second conductive traces) 62. The line width of the conductive trace 62 substantially ranges from about 0.5 μm and about 2 μm. The spacing of adjacent conductive traces 62 substantially ranges from about 0.5 μm and about 2 μm. The conductive pattern 60 may include a single-layered structure or a multi-layered structure. The material of the conductive pattern 60 may include copper (Cu) or the like. In some embodiments, the conductive pad 44 penetrates through the dielectric layer 30 from the first surface 30A to the second surface 30B, and electrically connected to the conductive pattern 60.

The semiconductor device package 1 may further include one or more semiconductor devices (which are also, but not limited to be, referred to as second semiconductor devices) 70 disposed on the second surface 30B of the dielectric layer 30. In some embodiments, the semiconductor device 70 may be bonded to the conductive traces 62 through conductors 64 such as micro bumps or the like. The semiconductor device package 1 may further include an encapsulation layer 72 encapsulating the semiconductor device 70. In some embodiments, the encapsulation layer 72 covers edges of the semiconductor device 70, and exposes an upper surface of the semiconductor device 70. In some embodiments, the encapsulation layer 72 may further cover the upper surface of the semiconductor device 70. The encapsulation layer 72 may also cover the second surface 30B of the dielectric layer 30. In some embodiments, the encapsulating layer 72 may further cover an edge 30C of the dielectric layer 30, helping enhance robustness of the semiconductor device package 1.

The dielectric layer 30 has a thickness substantially equal to or less than about 5 μm, which facilitates reduction of overall thickness of the semiconductor device package 1. The dielectric layer 30 has a surface uniformity substantially equal to or less than 5%, which increases the yield of formation of the conductive pattern 40 and/or the second conductive pattern 40 with ultra-fine line width and spacing. Accordingly, high density I/O counts can be achieved without increasing the area of the semiconductor device package 1. The thin dielectric layer 30 and the conductive pattern 40 and/or the second conductive pattern 40 with ultra-fine line width can also alleviate warpage of the semiconductor device package 1, and therefore improve the reliability of the semiconductor device package 1.

Figure 2A:
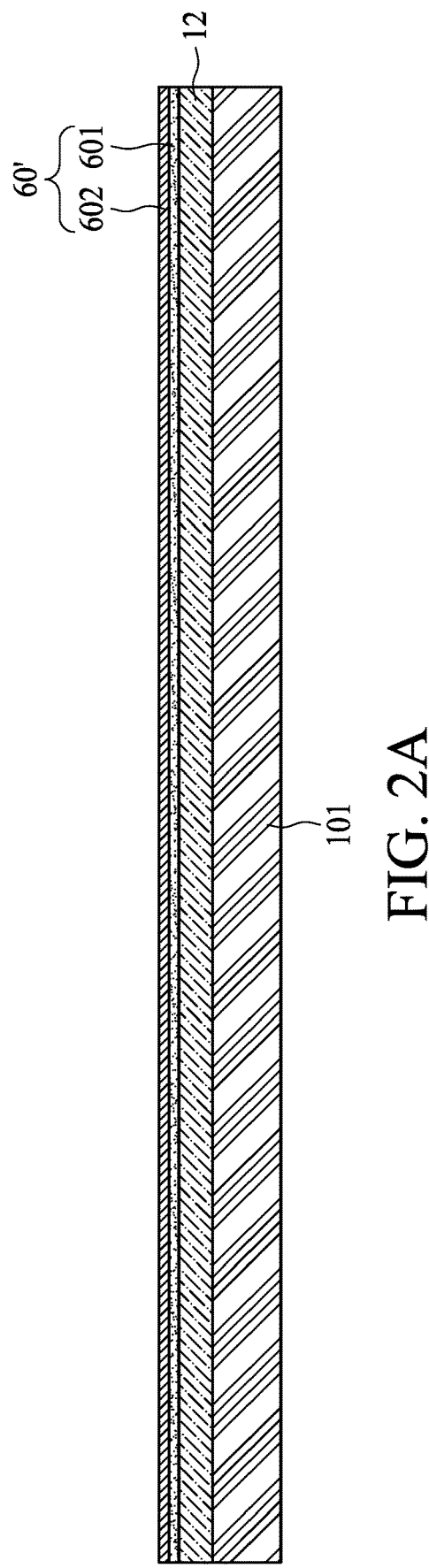
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N and FIG. 2O are schematic diagrams illustrating various stages of a method of fabricating a semiconductor device package in accordance with some embodiments of the present disclosure.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N and FIG. 2O are schematic diagrams illustrating various stages of a method of fabricating a semiconductor device package in accordance with some embodiments of the present disclosure. FIG. 3A is a perspective view of a spin coating apparatus for fabricating a dielectric layer, FIG. 3B is a cross-sectional view of a spin coating apparatus for fabricating a dielectric layer, and FIG. 3C is a top view of a spin coating apparatus for fabricating a dielectric layer in accordance with some embodiments of the present disclosure. As shown in FIG. 2A, a first carrier 101 is received and loaded in a processing chamber 110 of an apparatus 100. The first carrier 101 is configured as a temporary carrier, and will be removed in subsequent process. The shape of the first carrier 101 may include circular, rectangular or other shapes. The first carrier 101 may include a wafer, a panel or the like. The surface of the first carrier 101 may have high surface uniformity such that overlying layer(s) can have high surface uniformity.

In some embodiments, a releasing layer 12 is formed on the first carrier 101. A conductive layer 60' is formed on the releasing layer 12. In some embodiments, the conductive layer 60' includes a first conductive sub-layer 601, and a second conductive sub-layer 602 on the first conductive sub-layer 601. The first conductive sub-layer 601 may include a seed layer configured to grow the second conductive sub-layer 602, an adhesion layer configured to enhance adhesion of the second conductive sub-layer 602, or the like. The first conductive sub-layer 601 may be a titanium (Ti) layer or the like, and formed by a deposition process such as a physical vapor deposition (PVD) process or the like. The second conductive sub-layer 602 may be a copper (Cu) layer, and formed by a plating process or the like. In some embodiments, the thickness of the first conductive sub-layer 601 and/or the second conductive sub-layer 602 is substantially equal to or less than 2 micrometers.

Figure 2B:
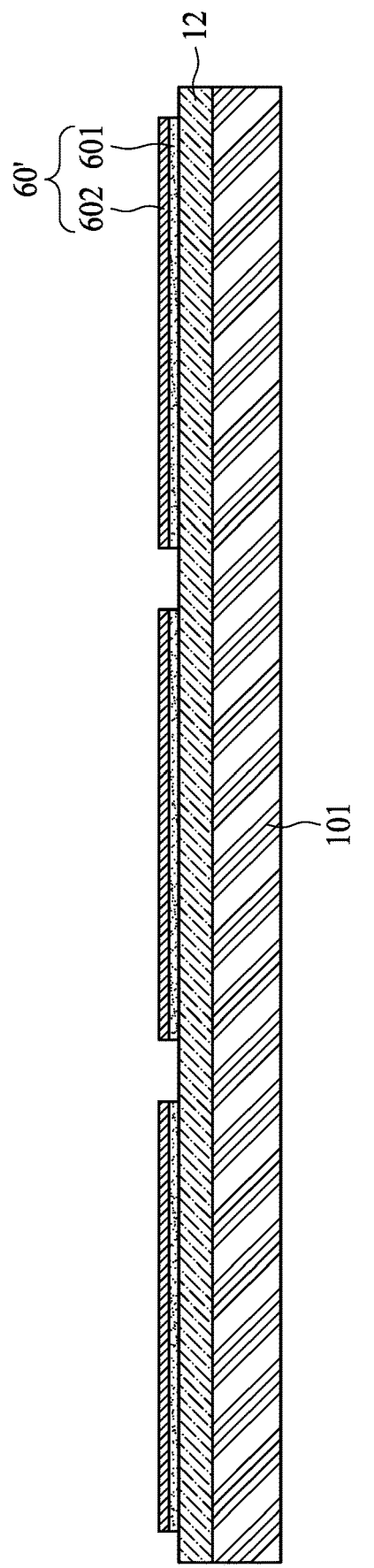
Figure 2C:
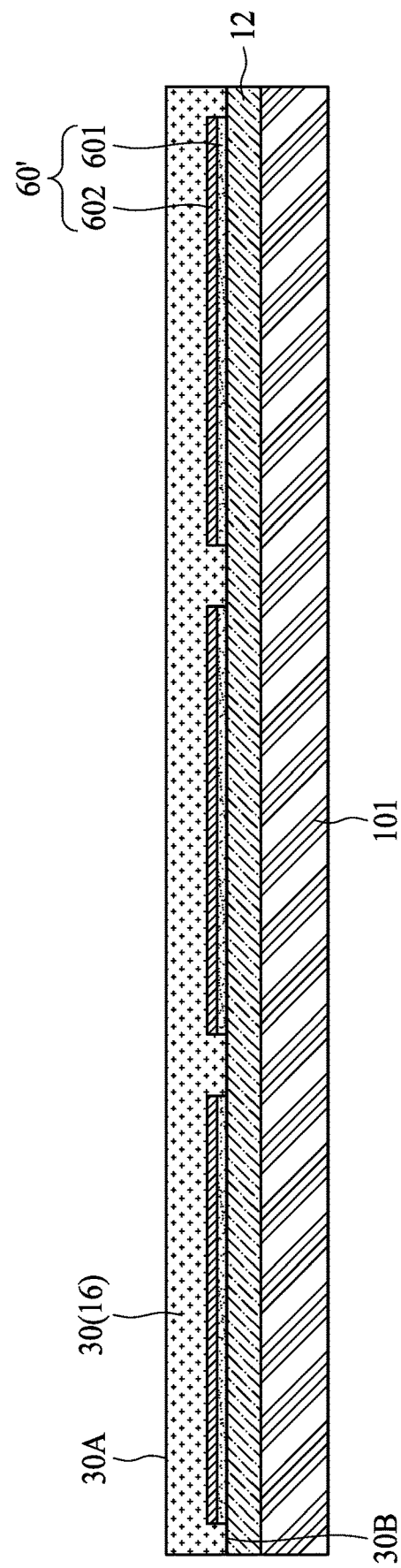
Figure 3A:
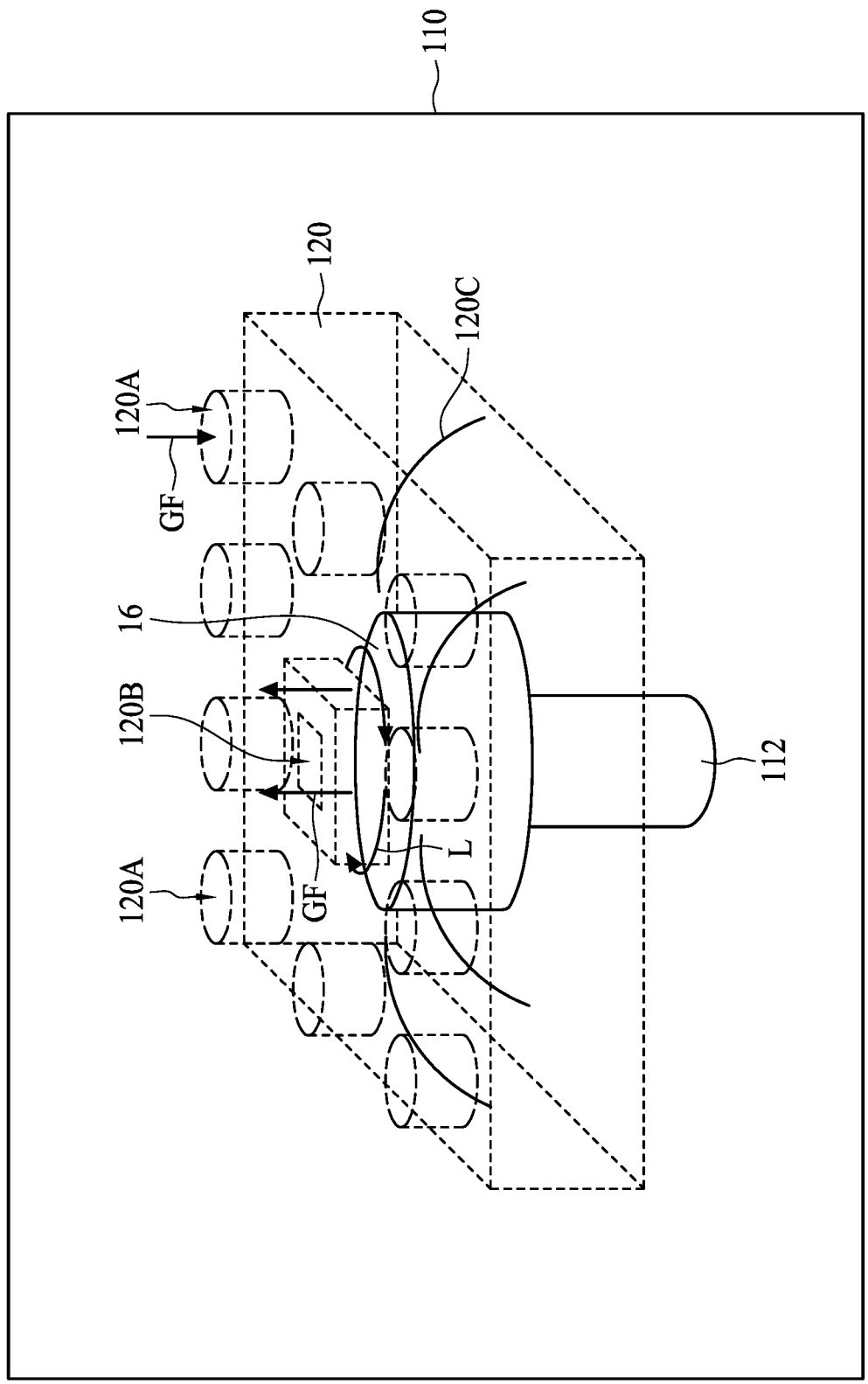
FIG. 3A is a perspective view of a spin coating apparatus for fabricating a dielectric layer.
Figure 3B:
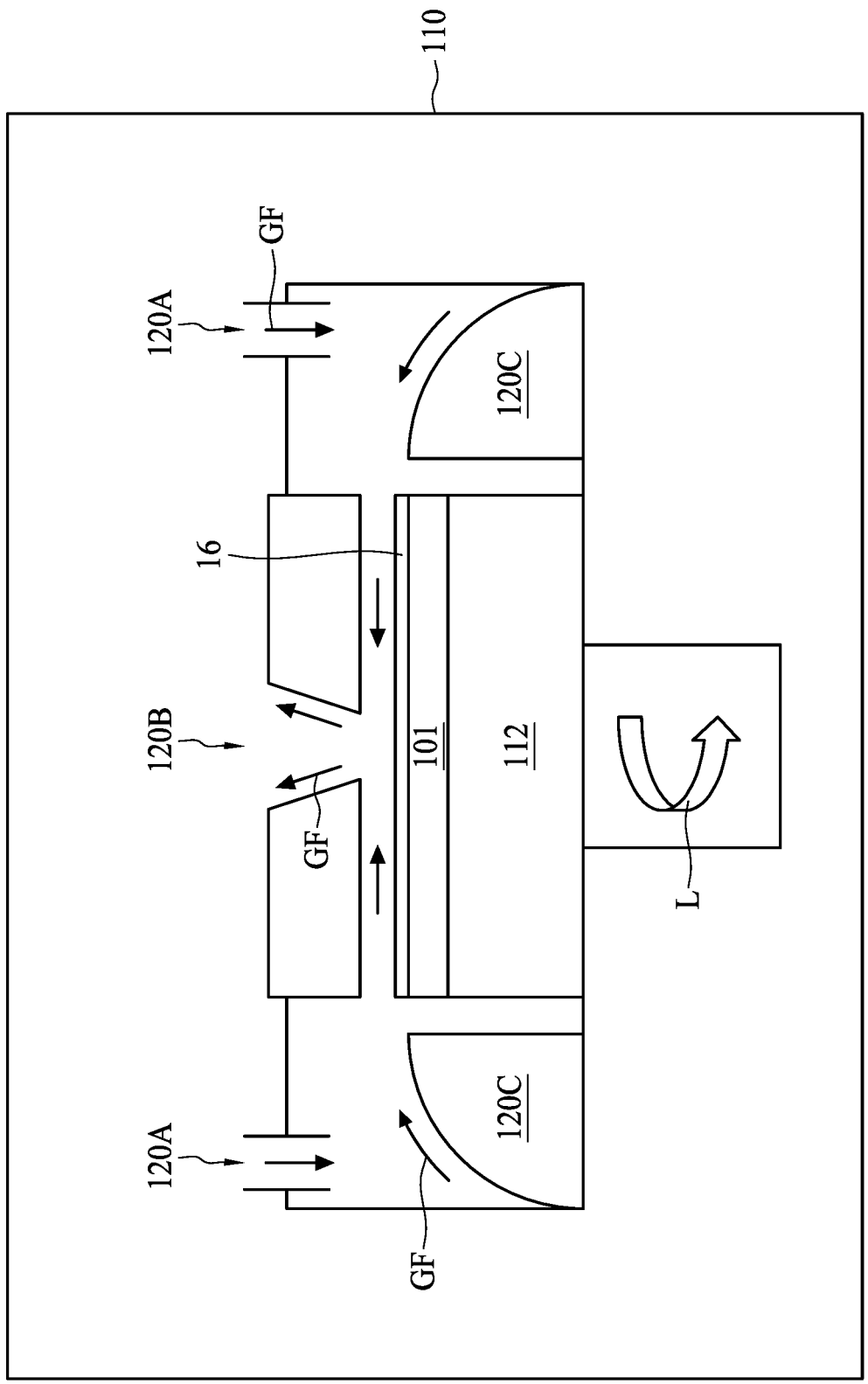
FIG. 3B is a cross-sectional view of a spin coating apparatus for fabricating a dielectric layer.
Figure 3C:
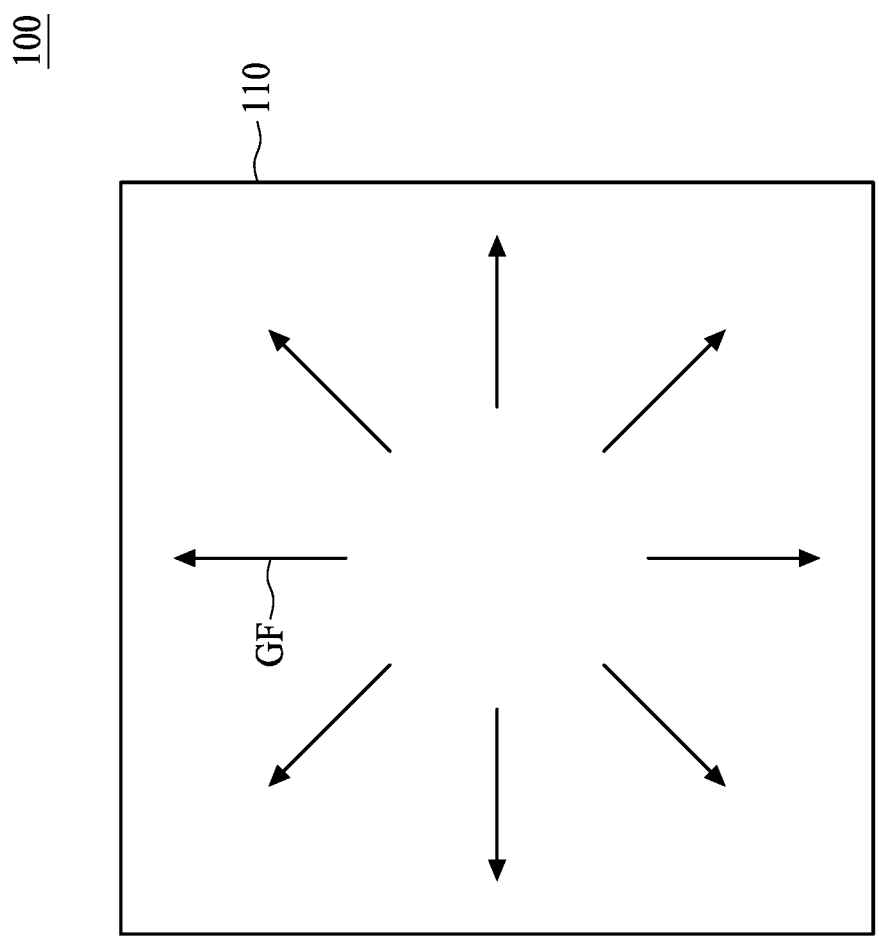
FIG. 3C is a top view of a spin coating apparatus for fabricating a dielectric layer in accordance with some embodiments of the present disclosure.

As shown in FIG. 2B, the conductive layer 60' is patterned, for example by photolithography and etching processes. As shown in FIG. 2C, a dielectric material 16 is formed on the first carrier 101 and the conductive layer 60'. In some embodiments, the dielectric material 16 is formed by spin coating apparatus as illustrated in FIGS. 3A-3C. The first carrier 101 is loaded in a processing chamber 110 of a spin coating apparatus 100. The apparatus 100 includes a holder 112 disposed at the bottom of the processing chamber 110, and a gas flow control unit 120 disposed at the top of the processing chamber 110. The holder 112 is configured to support the first carrier 101, and the holder 112 is rotatable to drive the first carrier 101 rotate during processing. The gas flow control unit 120 is disposed above the first carrier 101 in the processing chamber 100, and configured to control gas flow GF during the spin coating process. The gas flow control unit 120 includes one or more gas inlets 120A substantially corresponding to a periphery of the first carrier 101, and one or more gas outlets 120B substantially corresponding to a center of the first carrier 101. In some embodiments, the shape of the gas flow control unit 120 may include rectangular shape, a circular shape or other shapes. One or more gas inlets 120A is substantially arranged at the periphery of the gas flow control unit 120, and one or more gas outlets 120B is disposed at the center of the gas flow control unit 120. The gas inlet 120A may be connected to a gas supplier (not shown) to receive gases, and the gas outlets 120B may be connected to an exhaust pipe (not shown) to pump out the gases. The gas may include an inert gas such as nitrogen gas or the like. In some embodiments, the gas flow control unit 120 further includes a gas guider 120C disposed adjacent to the periphery of the first carrier 101 and configured to guide the gas flow GF. In some embodiments, the gas guider 120C may include a curved surface, helping guide the gas flow GF from the gas inlet 120A toward the first carrier 101.

In some embodiments, the dielectric material 16 may include a liquid-based dielectric material, a dry-film dielectric material or the like. The dielectric material 16 may be photosensitive, and solidified by optical curing. The material of the dielectric layer 30 may include organic dielectric material such as bismaleimide triazine (BT), Ajinomoto Build-up Film (ABF), polyimide (PI), epoxy or the like.

The dielectric material 16 is dispensed on the first carrier 101 and the conductive layer 60', and rotated in a direction L e.g., a clockwise direction during the spin coating process. During the spin coating process, gas flow GF is provided from the gas inlets 120A to the gas outlet 120B, flowing over the dielectric material 16. The gas flow GF represents the flow of gas that flows inside the environment of the processing chamber 110 during the spin coating process. The gas flow GF is not just generated by rotation of the holder 112 during the spin coating process, but is also provided by introduction of gas into the processing chamber 110 during the spin coating process. The gas flow GF can help evenly exhaust solvent out of the dielectric material 16, such that the dielectric material 16 is converted into a dielectric layer 30 with high surface uniformity. The dielectric layer 30 has a second surface 30B facing the conductive layer 60', and a first surface 30A opposite to the second surface 30B.

Figure 4A:
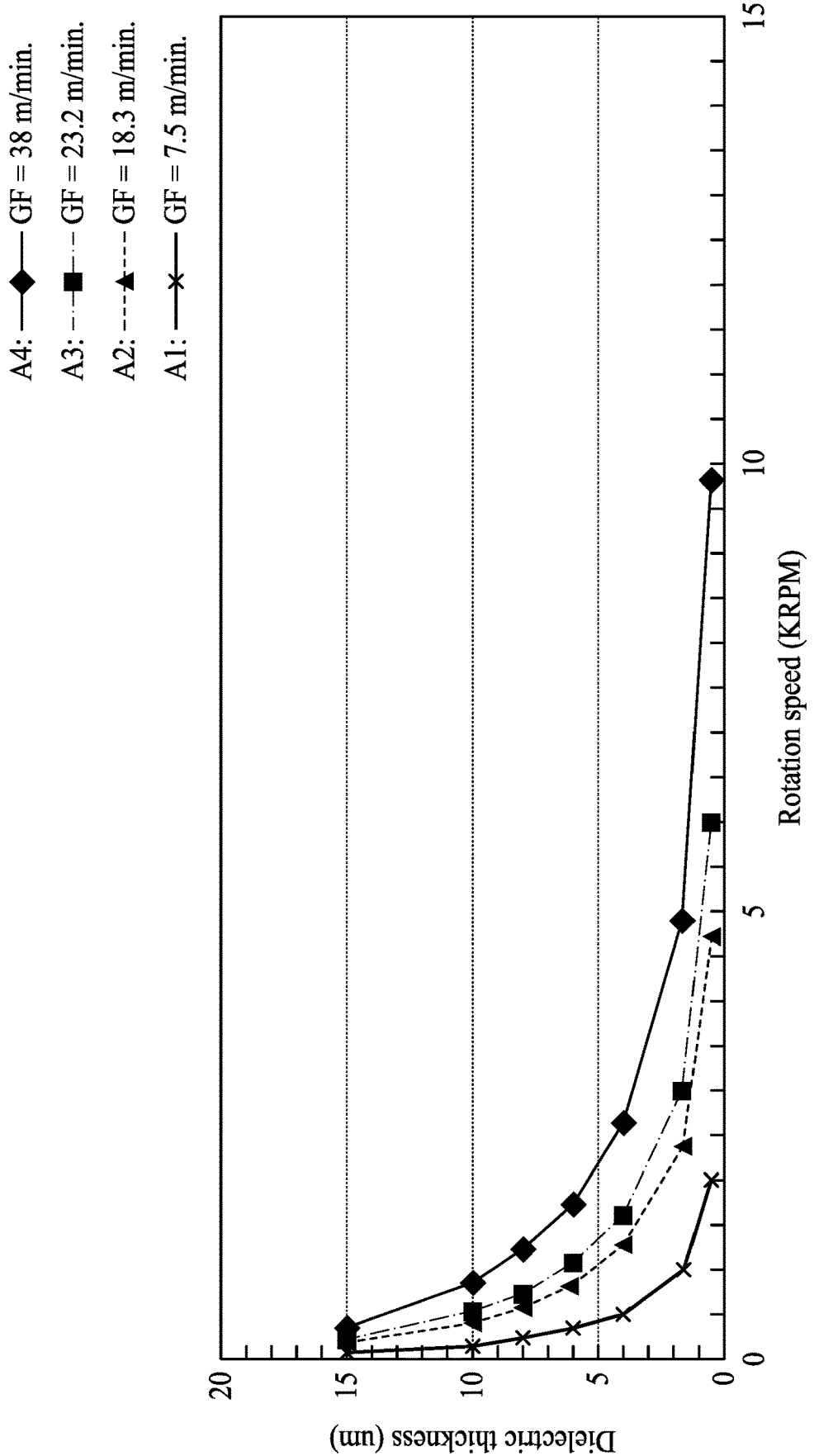
FIG. 4A is an experimental result showing a relation between rotation speed of the holder in the spin coating process and thickness of the dielectric layer.
Figure 4B:
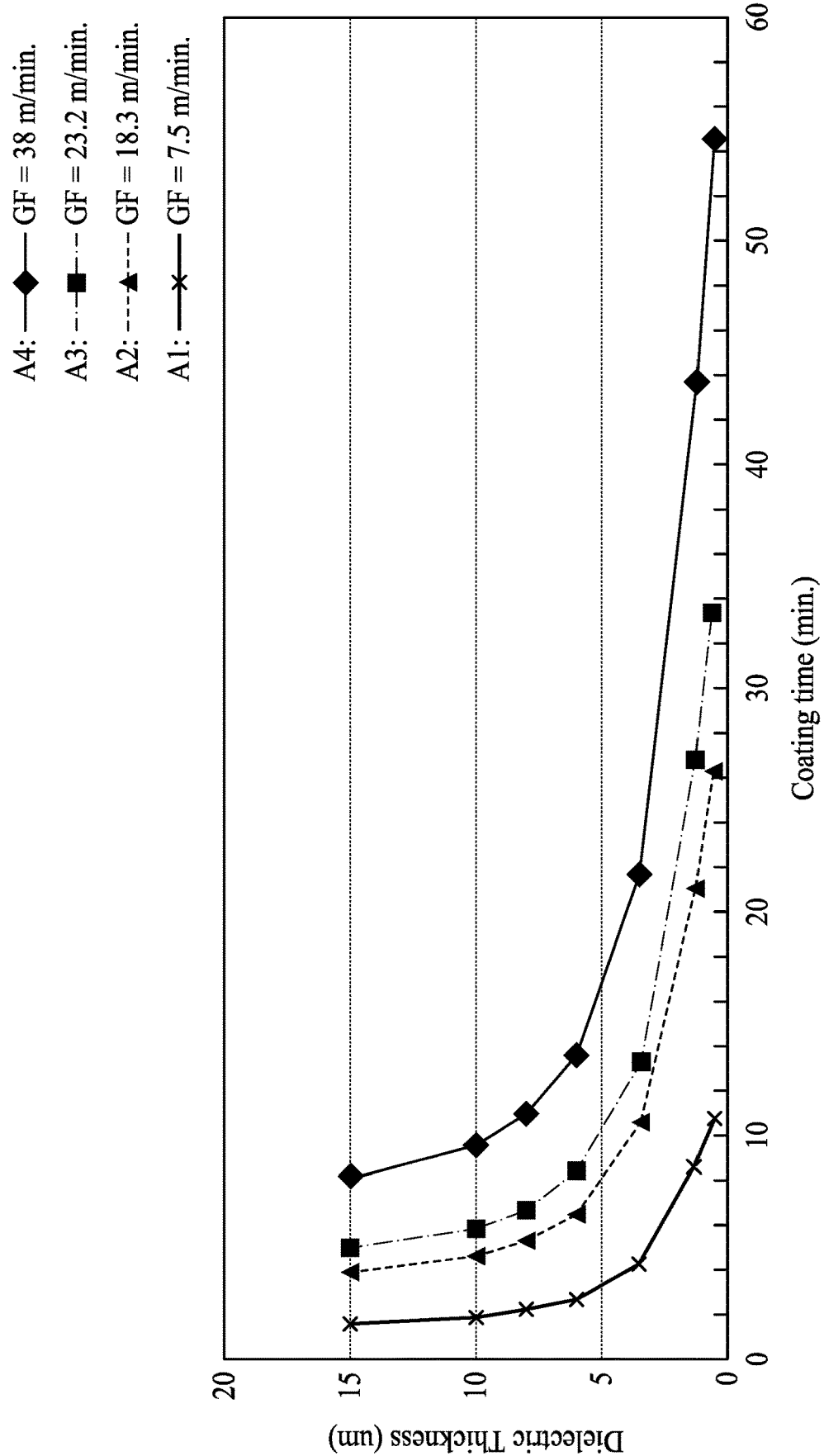
FIG. 4B is an experimental result showing a relation between coating time in the spin coating process and thickness of the dielectric layer.
Figure 4C:
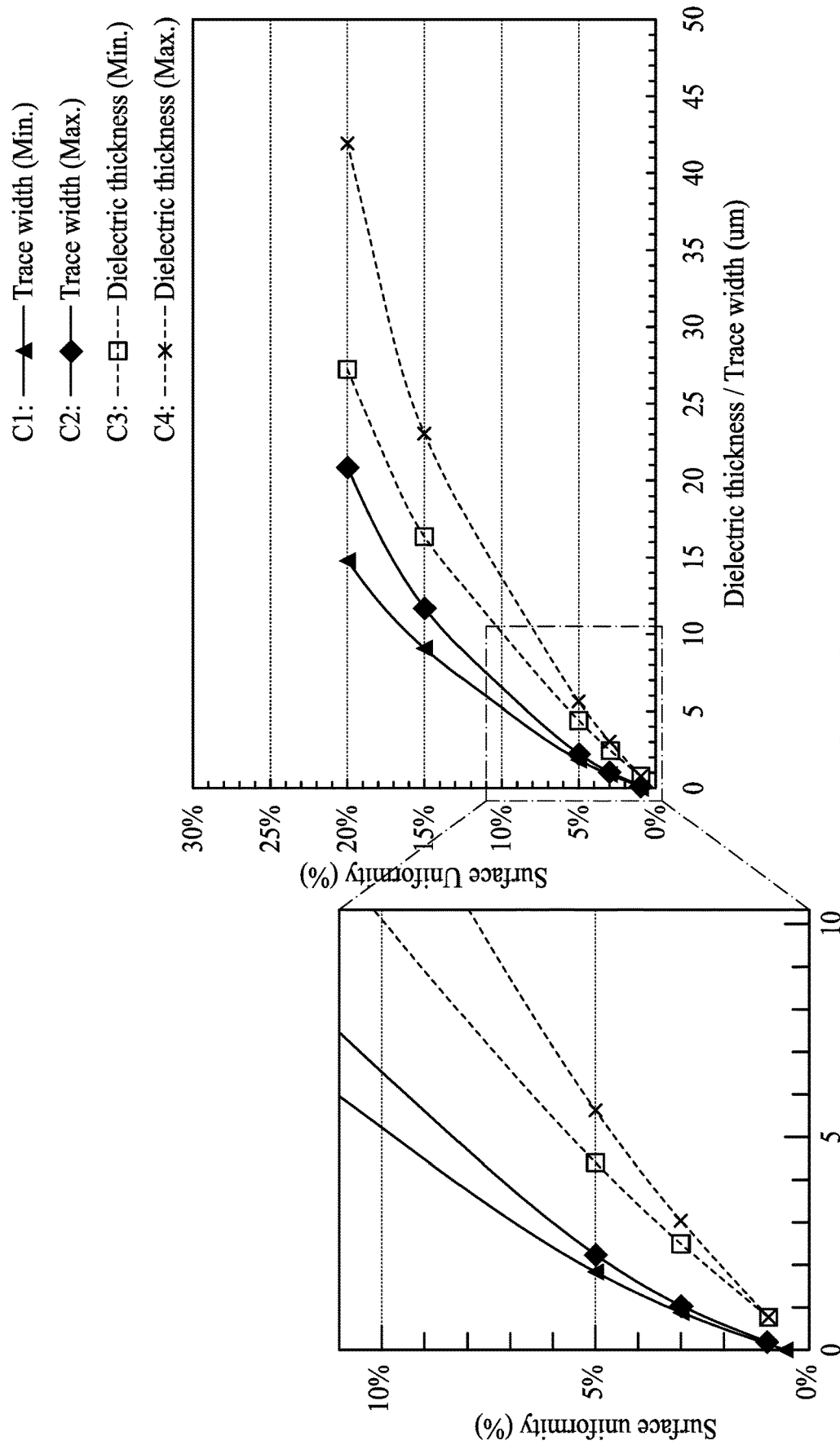
FIG. 4C is an experimental result showing a relation between surface uniformity and thickness of the dielectric layer/the width of the conductive trace formed on the dielectric layer.

FIG. 4A is an experimental result showing a relation between rotation speed of the holder in the spin coating process and thickness of the dielectric layer. FIG. 4B is an experimental result showing a relation between coating time in the spin coating process and thickness of the dielectric layer. FIG. 4C is an experimental result showing a relation between surface uniformity and thickness of the dielectric layer/the width of the conductive trace formed on the dielectric layer. In FIGS. 4A and 4B, curves C1-C4 represents data obtained when the gas flow GF is 7.5 m(meter)/min(minute), 18.3 m/min, 23.2 m/min and 38 m/min, respectively. As shown in FIGS. 4A and 4B, the dielectric thickness is substantially proportional with respect to the gas flow GF, and substantially inversely proportional to the rotation speed and coating time. In FIG. 4C, curve B1 represents data of the dielectric layer with maximum thickness, curve B2 represents data of the dielectric layer with minimum thickness, curve C1 represents data of the conductive trace with maximum width, and curve C2 represents data of the conductive trace with maximum width. As shown in FIG. 4C, when the thickness of the dielectric layer formed by spin coating with gas flow ranges from about 7.5 m/min to about 38 m/min is equal to or less than about 5 μm, the surface uniformity of the dielectric layer is less than or equal to about 5%. The width of the conductive trace formed on the dielectric layer with higher surface uniformity can be reduced to about 2 μm. In case the gas flow GF is higher than 38 m/min, the dielectric layer may have a concave surface, e.g., the thickness in the periphery region would be thicker than the thickness in the center region. In case the gas flow GF is lower than 2.0 m/min, the actual thickness of the dielectric layer would be lower than its expected thickness.

Figure 2D:
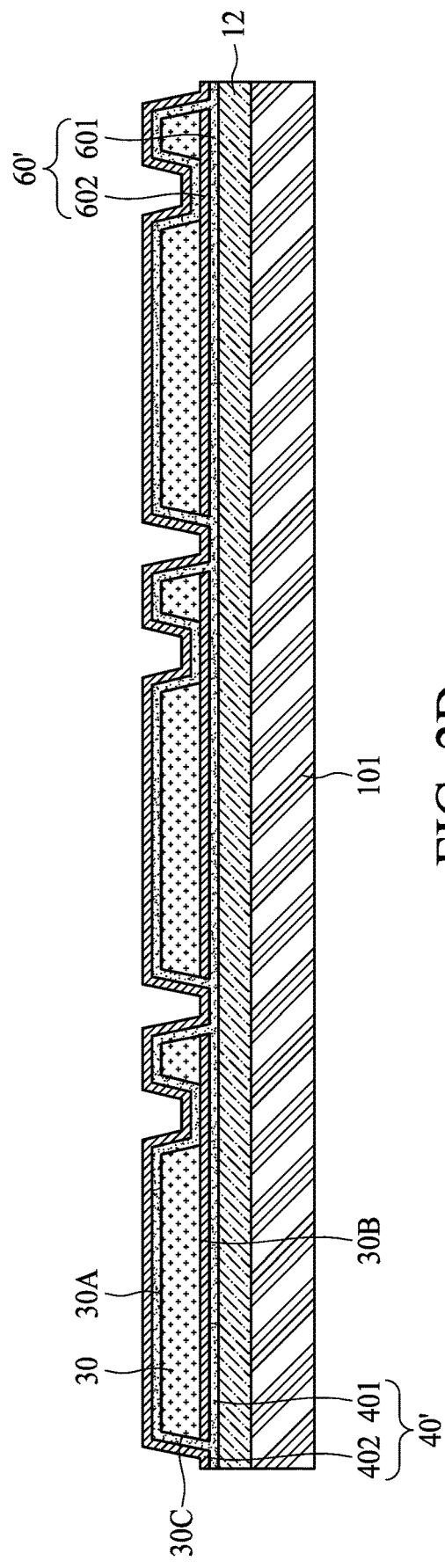

As shown in FIG. 2D, the dielectric layer 30 is then patterned by e.g., a photolithography process. In some embodiments, the dielectric layer 30 is through after the photolithography process, and the conductive layer 60' is partially exposed. Another conductive layer 40' is formed on the first surface 30A of the dielectric layer 30. The conductive layer 40' can be electrically connected to the conductive layer 60' exposed from the dielectric layer 30. After patterning, the dielectric layer 30 includes an edge 30C. In some embodiments, the edge 30C may be, but is not limited to be, inclined outward with respect to the second surface 30B. The conductive layer 40' formed on the inclined edge 30C may have better adhesion and step coverage. In some embodiments, the conductive layer 40' includes a first conductive sub-layer 401, and a second conductive sub-layer 402 on the first conductive sub-layer 401. The first conductive sub-layer 401 may include a seed layer configured to grow the second conductive sub-layer 402, an adhesion layer configured to enhance adhesion of the second conductive sub-layer 402, or the like. The first conductive sub-layer 401 may be a titanium (Ti) layer or the like, and formed by a deposition process such as a physical vapor deposition (PVD) process or the like. The second conductive sub-layer 402 may be a copper (Cu) layer, and formed by a plating process or the like. In some embodiments, the thickness of the first conductive sub-layer 401 and/or the second conductive sub-layer 402 is substantially equal to or less than 2 μm. Since the surface uniformity of the dielectric layer 30 is high, for example equal to or less than 5%, the conductive layer 40' formed on the dielectric layer 30 has a flat and uniform surface accordingly.

Figure 2E:
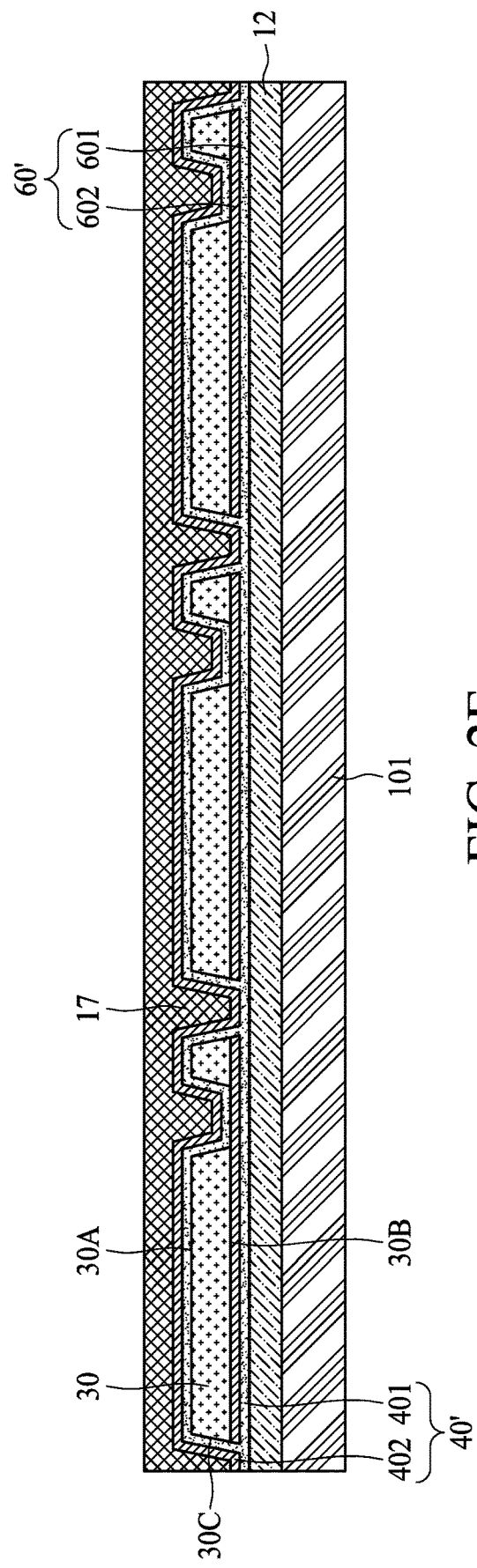
Figure 2F:
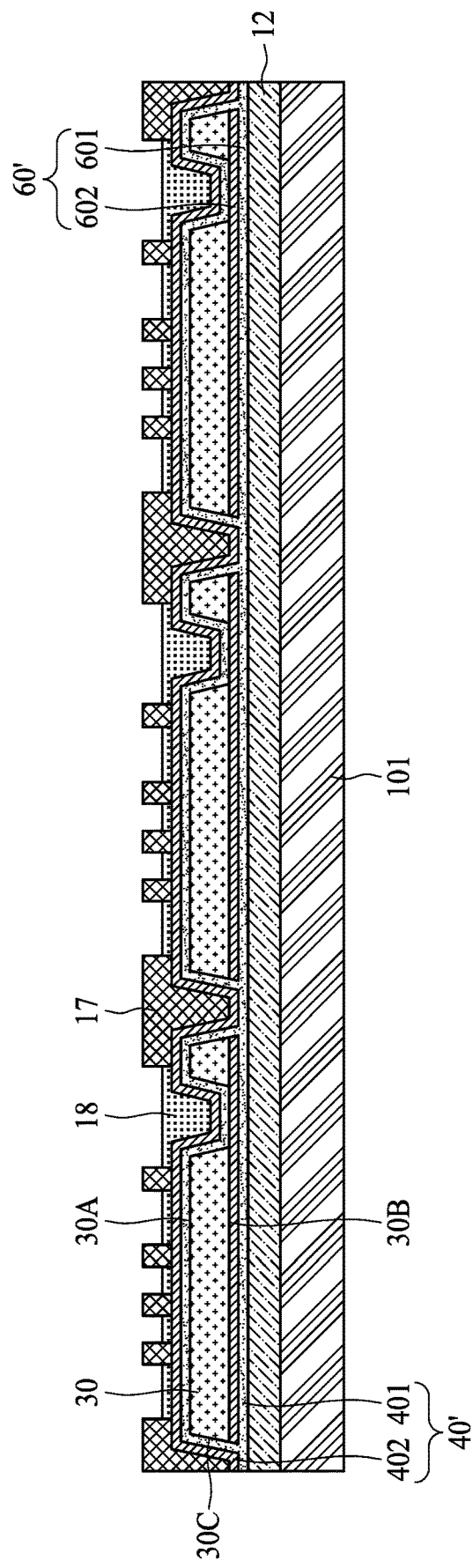

As shown in FIG. 2E, a photoresist layer 17 is formed on the conductive layer 40'. As shown in FIG. 2F, the photoresist layer 17 is patterned by e.g., photolithography process to expose a portion of the conductive layer 40'. Since the conductive layer 40' has a flat and uniform surface, the patterned photoresist layer 17 can stand steadily on the conductive layer 40'. A conductive material 18 such as copper (Cu) is formed on the conductive layer 40' exposed from the patterned photoresist layer 17. By way of example, the conductive material 18 is formed on the conductive layer 40' by plating or the like.

Figure 2G:
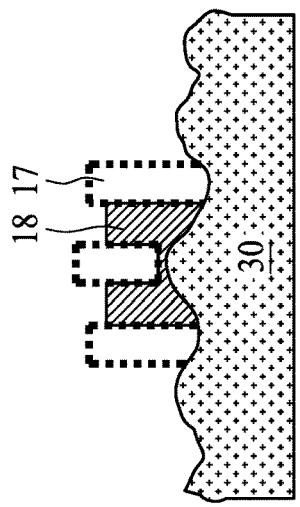
Figure 2G:
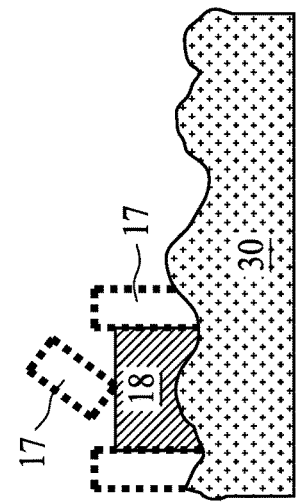
Figure 2G:
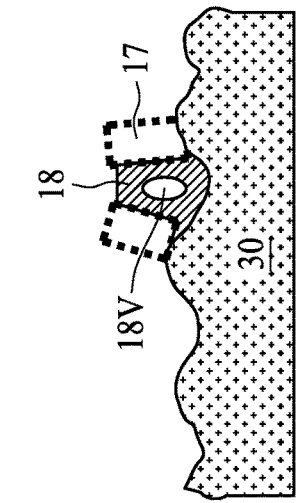
Figure 2G:
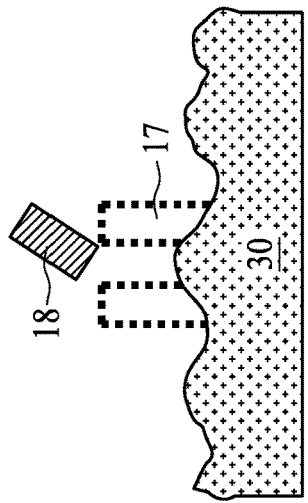
Figure 2G:
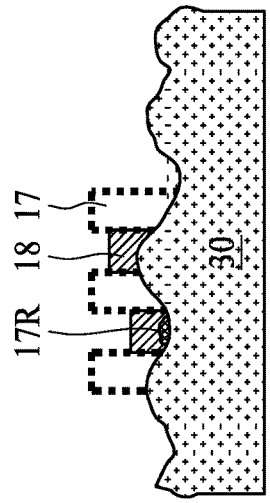
Figure 2G:
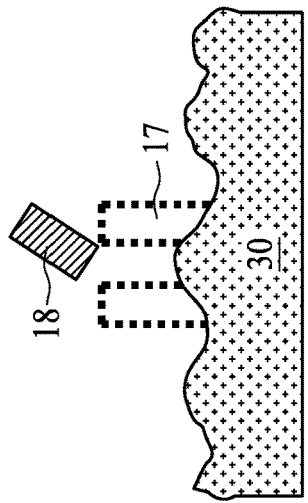

FIG. 2G depicts several scenario cases in which the surface uniformity of the dielectric layer 30 is larger than 5% when the conductive material 18 is formed. As shown in scenario case (A), when the surface uniformity of the dielectric layer 30 is larger than 5%, the patterned photoresist layer 17 formed on the dielectric layer 30 may tilt, causing formation of void 18V in the conductive material 18. The existence of void 18 V would seriously affect electrical performance of the conductive material 18. As shown in scenario case (B), some piece of the photoresist layer 17 may fall from the uneven surface of the dielectric layer 30, and adhere to the surface of the conductive material 18, causing poor connection. As shown in scenario case (C), some fallen piece of the photoresist layer 17 may be inserted into the conductive material 18, causing open circuitry issue. As shown in scenario case (D), some pieces of the photoresist layer 17 may tilt, forming a sealed space. The conductive material 18 is unable to be formed in the sealed space. As shown in scenario case (E), photoresist residue 17R may exist on the dielectric layer 30 because the uneven surface of the dielectric layer 30 adversely affects the photolithography process. Also, the height of the conductive material 18 may be varied due to the poor surface uniformity of the dielectric layer 30. The poor height uniformity of the conductive material 18 affects the yield of successive bonding process. As shown in scenario case (F), some conductive material 18 may fall from the dielectric layer 30 due to the low surface uniformity of the dielectric layer 30.

The dielectric layer 30 having a surface uniformity substantially equal to or less than 5% allows the photoresist layer 17 to steadily stand thereon, ensuring the accuracy of the photolithography process for patterning the photoresist layer 17, and improving the yield of formation of the conductive material 18.

Figure 2H:
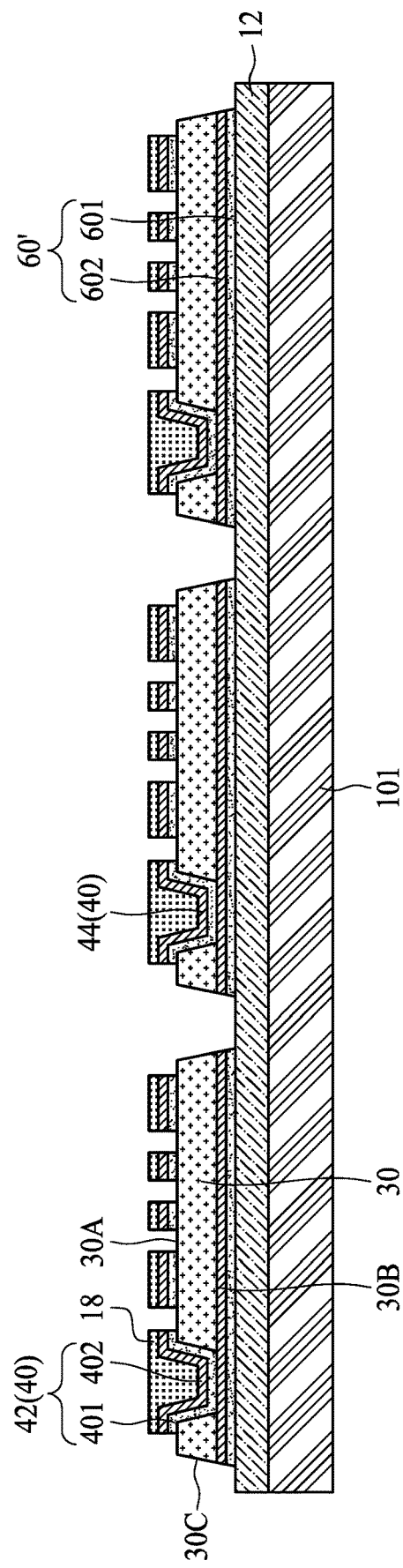

As shown in FIG. 2H, the photoresist layer 17 is removed by e.g., stripping, from the dielectric layer 30. The conductive material 18 and the conductive layer 40' are then patterned by e.g., photolithography and etching processes to form a conductive pattern 40 having conductive traces 42 and conductive pads 44. In some embodiments, the conductive layer 40' is etched by spraying an etchant such as an etchant solution, rather than by immersing the conductive layer 40' in the etchant solution, to help form the conductive pattern 40 with ultra-fine line width. In some embodiments, the line width and spacing of the conductive trace 42 may substantially range from about 0.5 μm and about 2 μm.

Figure 2I:
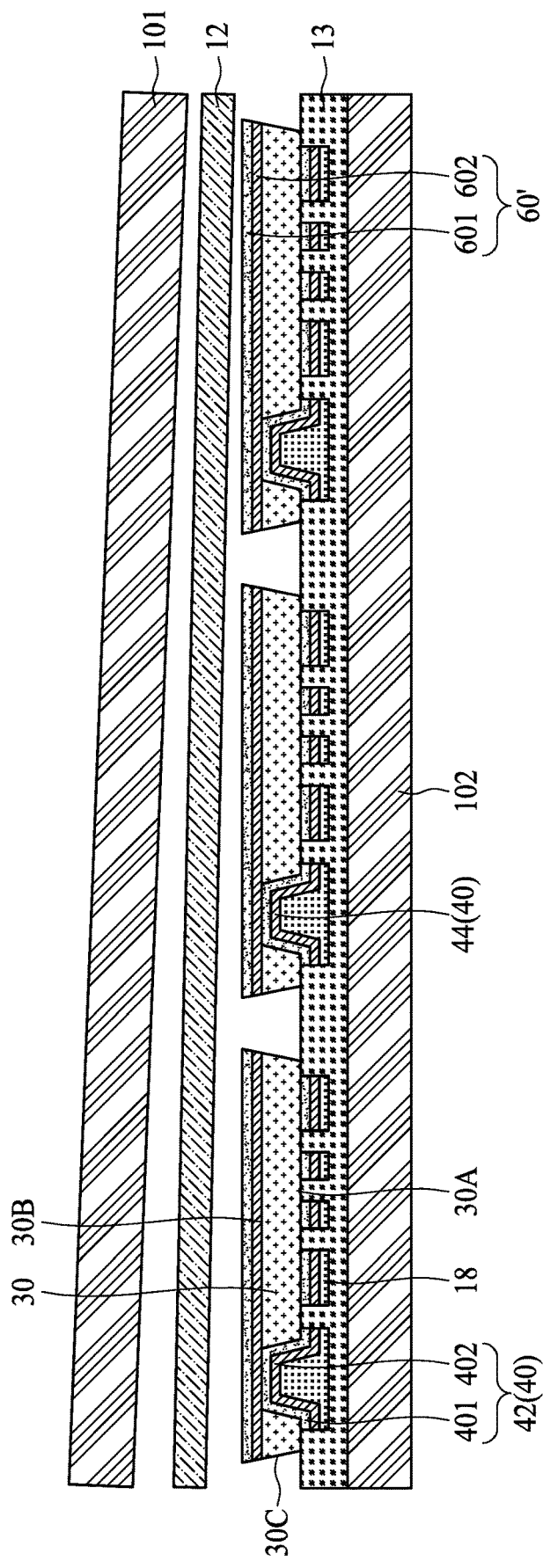

As shown in FIG. 2I, the conductive layer 40' is bonded to a second carrier 102, and the first carrier 101 and the releasing layer 12 are released from the dielectric layer 30. The releasing layer 12 may be cured for example by thermal curing or the like to reduce its adhesion, such that the first carrier 101 can be removed from the dielectric layer 30 without damaging the conductive layer 60'. In some embodiments, the conductive layer 40' is bonded to the second carrier 102 with another releasing layer 13.

Figure 2J:
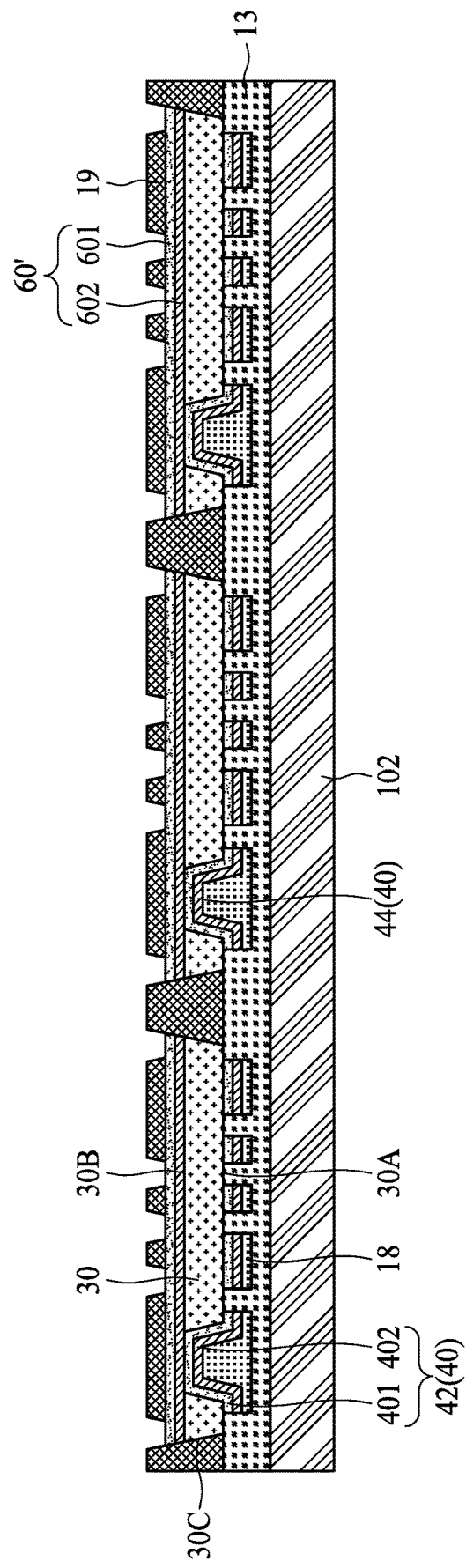
Figure 2K:
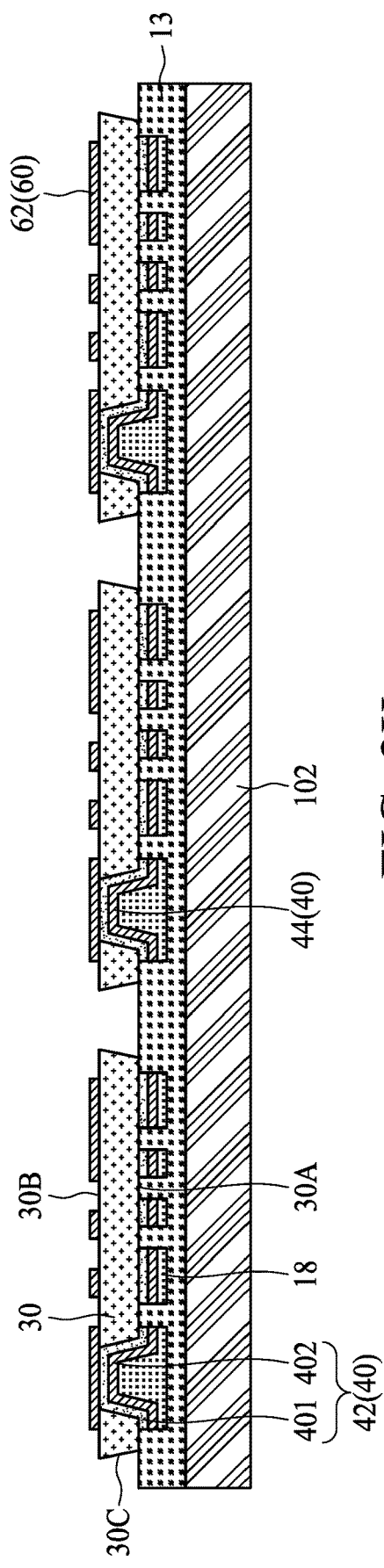

As shown in FIG. 2J, another photoresist layer 19 is formed on the conductive layer 60'. The photoresist layer 19 exposes a portion of the conductive layer 60'. As shown in FIG. 2K, the conductive layer 60' is patterned by, e.g., an etching process using the photoresist layer 19 as an etching mask to form a conductive pattern 60 including conductive traces 62. The photoresist layer 19 is then removed. In some embodiments, the first conductive sub-layer 601 may be removed, while the second conductive sub-layer 602 may remain on the dielectric layer 30. In some other embodiments, the first conductive sub-layer 601 and the second conductive sub-layer 602 may be patterned and remain on the dielectric layer 30. In some embodiments, the conductive layer 60' is etched by spraying an etchant such as an etchant solution, rather than by immersing the conductive layer 60' in the etchant solution, to help form the conductive pattern 60 with ultra-fine line width.

Figure 2L:
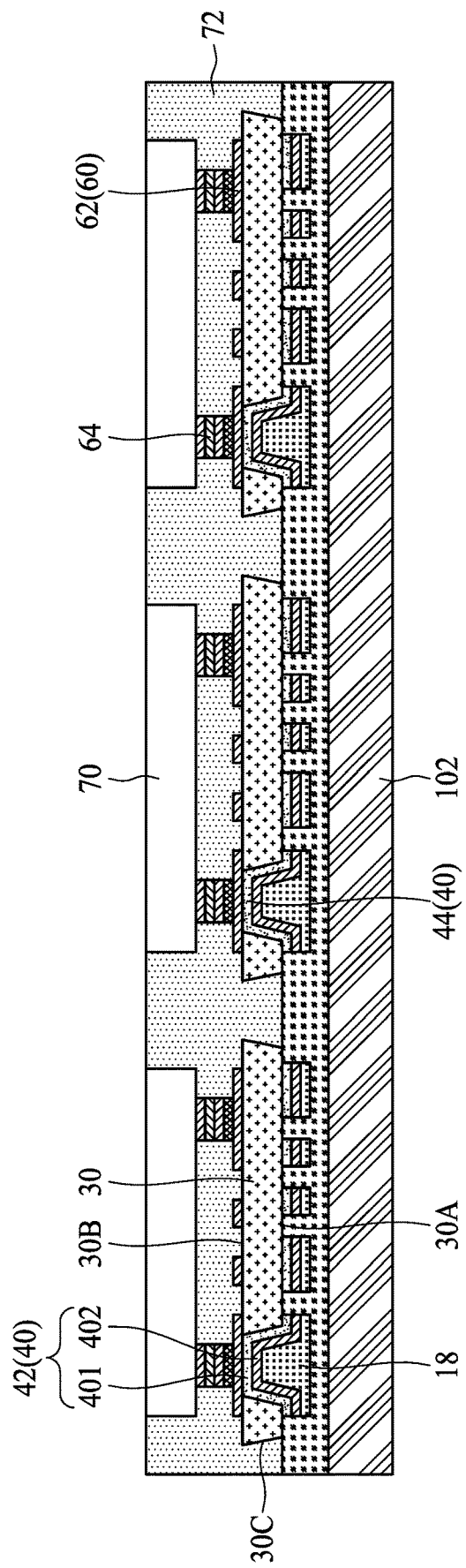

As shown in FIG. 2L, a plurality of semiconductor devices 70 are bonded to the conductive traces 62 through conductors 64. In some embodiments, the conductors 64 may include micro bumps or the like. An encapsulation layer 72 may be formed to encapsulate the semiconductor device 70. In some embodiments, the encapsulation layer 72 covers edges of the semiconductor device 70, and exposes an upper surface of the semiconductor device 70. The encapsulation layer 72 may also be interposed between the semiconductor devices 70 and the dielectric layer 30, serving as a molding underfill (MUF). Since the dielectric layer 30 is patterned, the encapsulation layer 72 may cover an edge 30C of the dielectric layer 30, helping enhance robustness of the semiconductor device package.

Figure 2M:
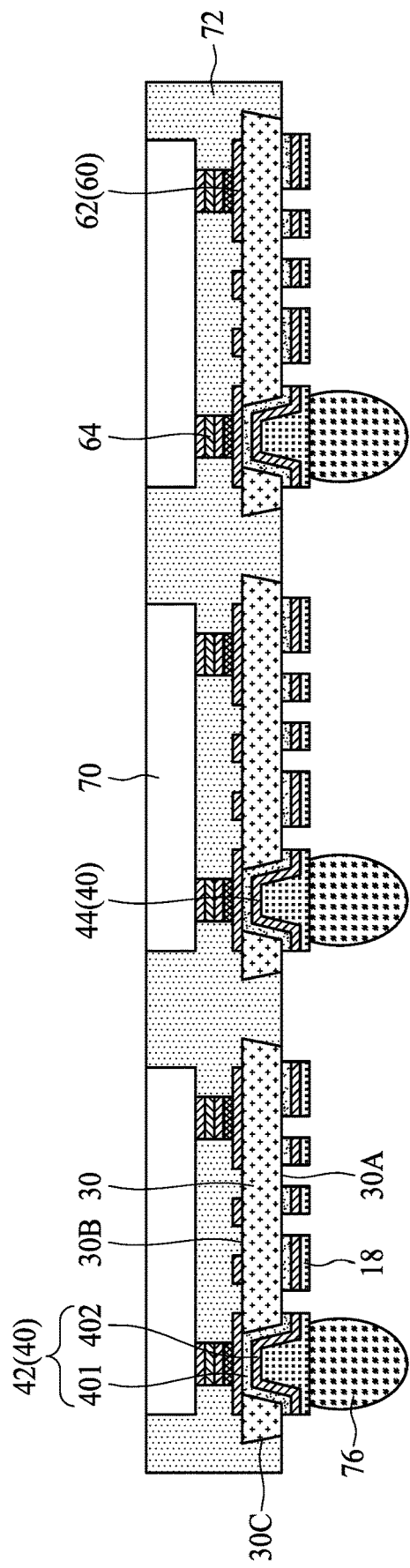

As shown in FIG. 2M, the second carrier 102 and the releasing layer 13 are released from the dielectric layer 30. The releasing layer 13 may be cured for example by thermal curing or the like to reduce its adhesion, such that the second carrier 102 can be removed from the dielectric layer 30 without damaging the conductive pattern 40. A plurality of connection elements 76 may be then formed on the conductive pads 44. The connection elements 76 may include conductive balls such as solder balls, conductive bumps such as solder bumps, conductive pillars or the like.

Figure 2N:
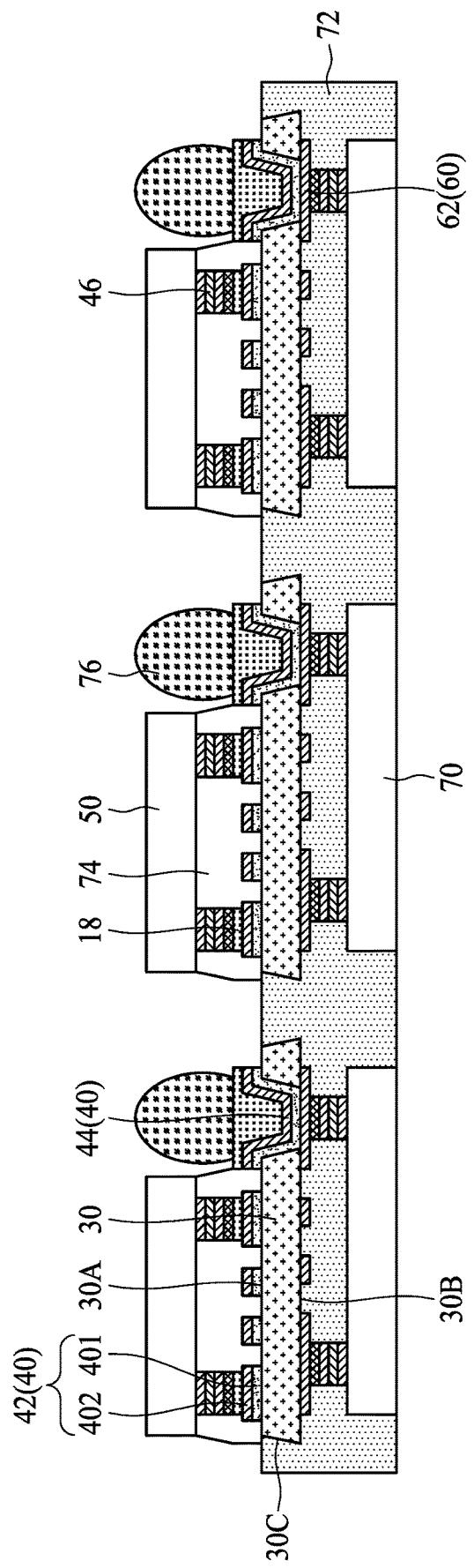
Figure 2O:
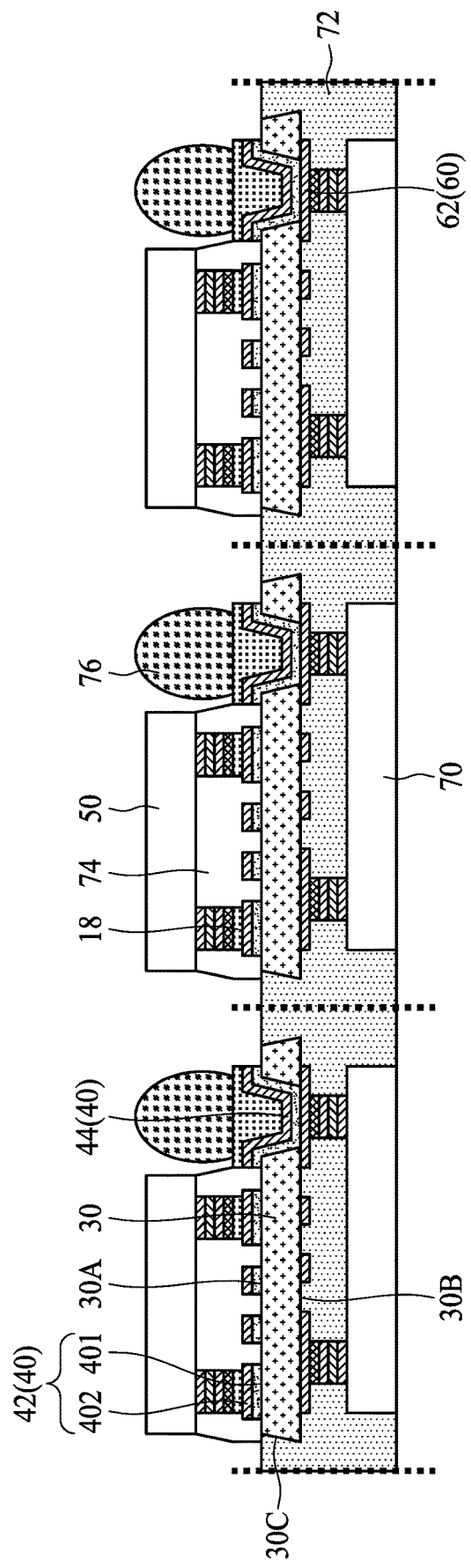

As shown in FIG. 2N, a plurality of semiconductor devices 50 are bonded to the conductive traces 42. In some embodiments, the semiconductor device 50 may be bonded to the conductive traces 42 through conductors 46 such as micro bumps or the like. The conductor 46 may be a multi-layered structure including a stack of multiple conductive materials. In some embodiments, an underfill 74 may be formed between the semiconductor devices 50 and the dielectric layer 30. As shown in FIG. 2O, a singulation process is performed to form a plurality of semiconductor devices 1 as illustrated in FIG. 1.

Semiconductor device packages provided for by the present disclosure are not limited to the above-described embodiments, and may include other, different embodiments, such as those described below. To simplify the description and for convenient comparison between each of the embodiments of the present disclosure, the same or similar components in each of the following embodiments are marked with the same numerals and are not redundantly described.

Figure 5:
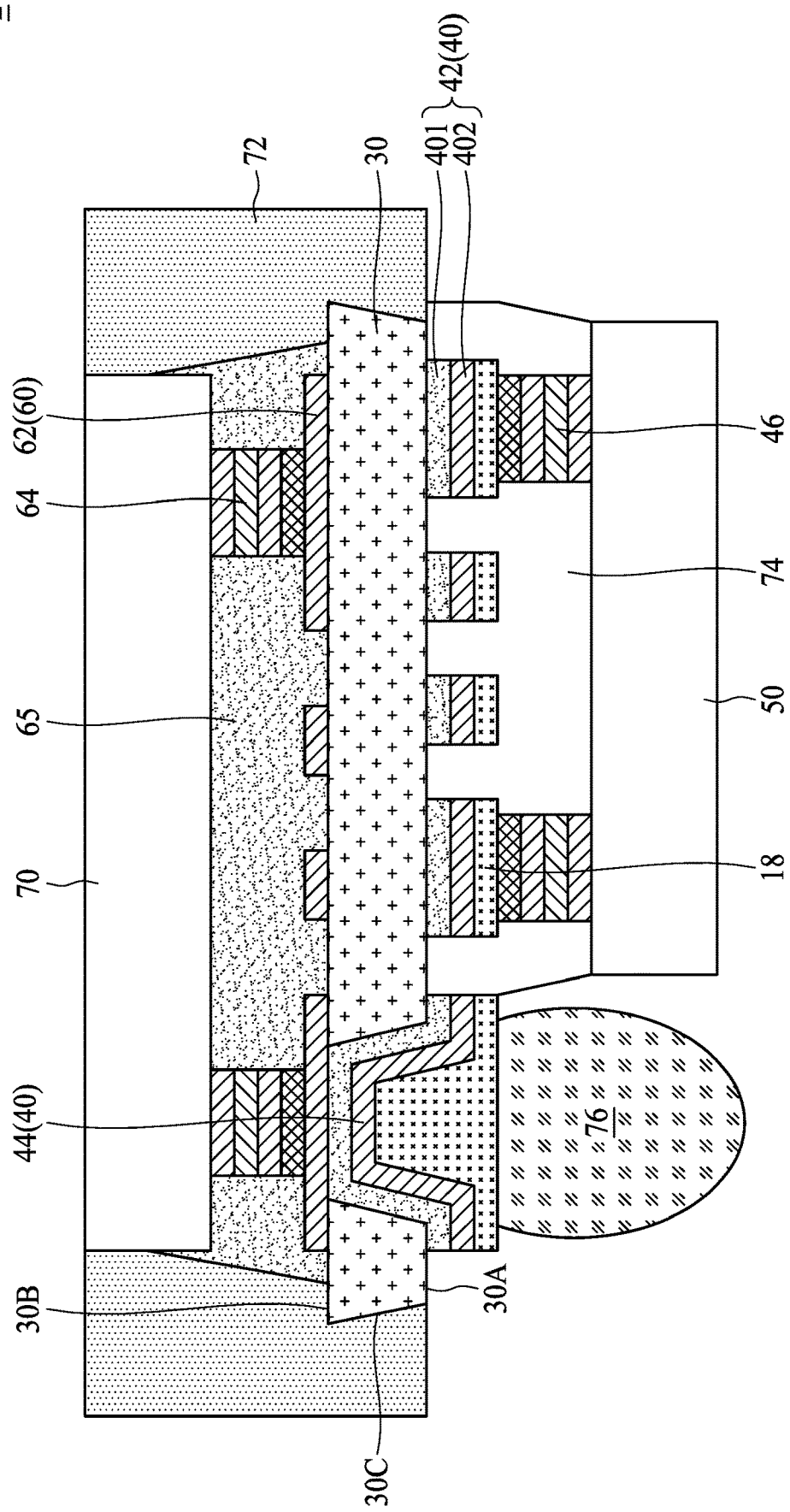
FIG. 5 is a schematic diagram illustrating a semiconductor device package in accordance with some embodiments of the present disclosure.

FIG. 5 is a schematic diagram illustrating a semiconductor device package 2 in accordance with some embodiments of the present disclosure. As shown in FIG. 5, the semiconductor device package 2 further includes an underfill 65 disposed between semiconductor device 70 and the dielectric layer 30.

Figure 6:
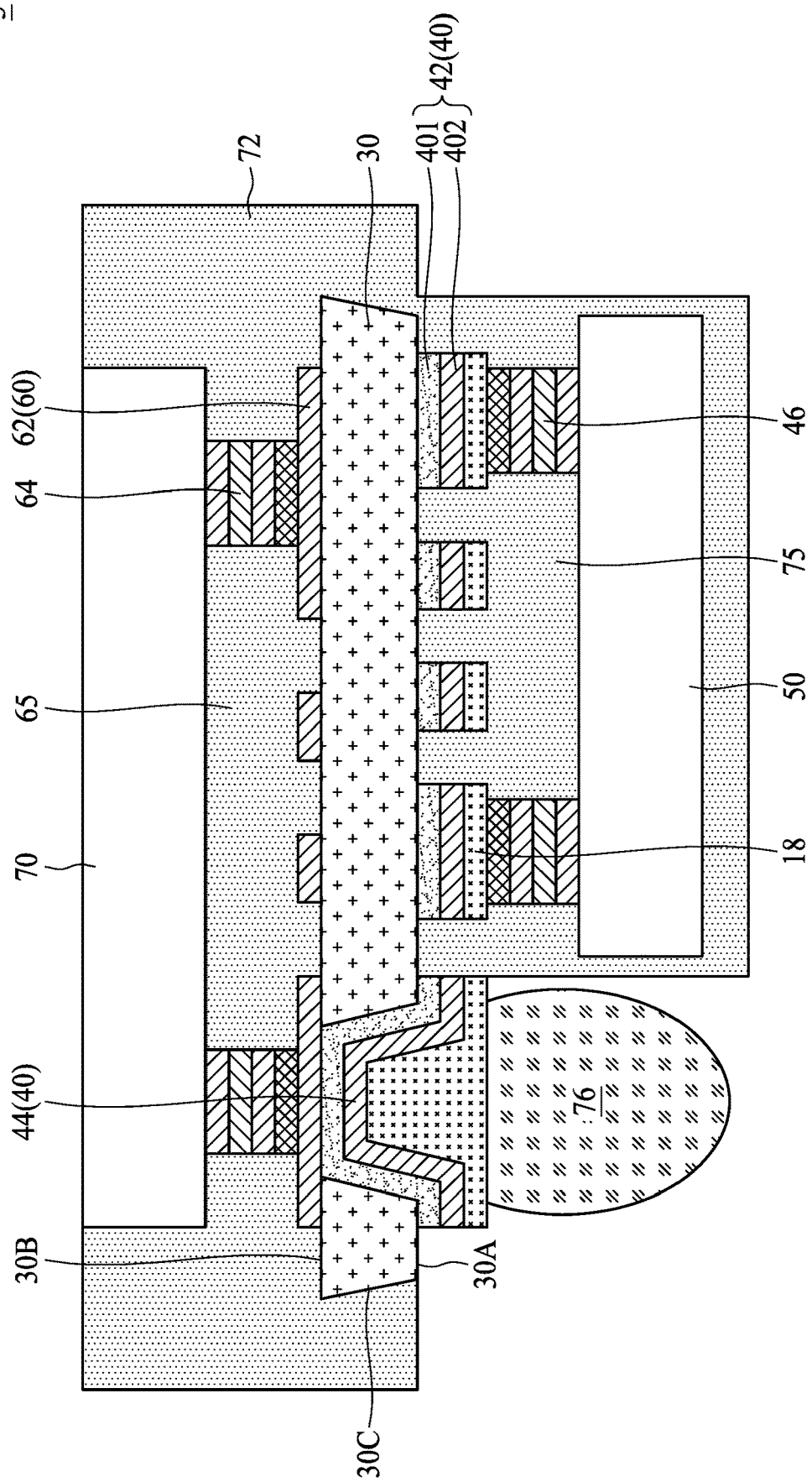
FIG. 6 is a schematic diagram illustrating a semiconductor device package in accordance with some embodiments of the present disclosure.

FIG. 6 is a schematic diagram illustrating a semiconductor device package 3 in accordance with some embodiments of the present disclosure. As shown in FIG. 6, the semiconductor device package 3 further includes an encapsulation layer 75 encapsulating the semiconductor device 50. In some embodiments, the encapsulating layer 75 may be further disposed between semiconductor device 50 and the dielectric layer 30, serving as a molding underfill (MUF).

Figure 7:
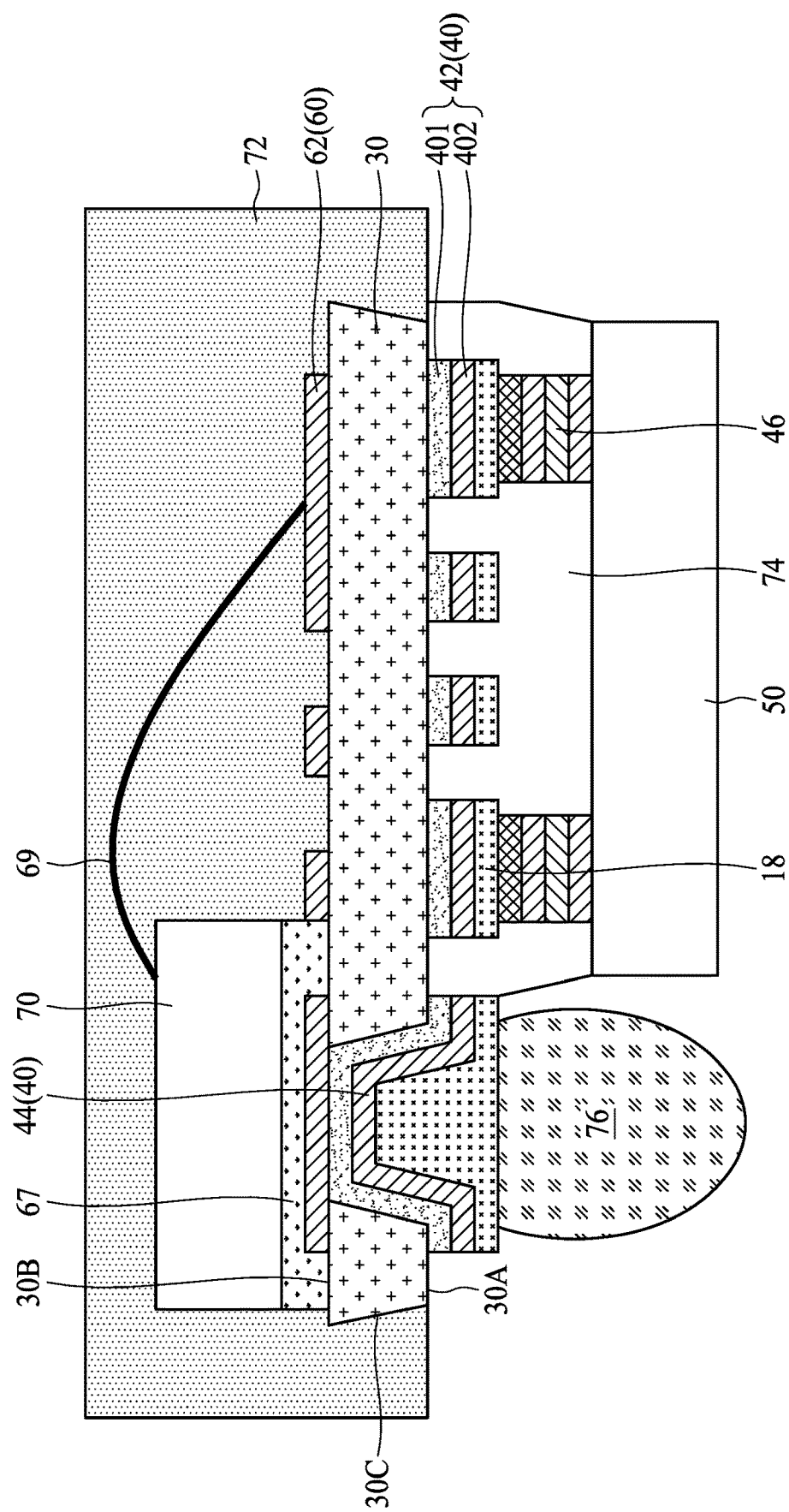
FIG. 7 is a schematic diagram illustrating a semiconductor device package in accordance with some embodiments of the present disclosure.

FIG. 7 is a schematic diagram illustrating a semiconductor device package 4 in accordance with some embodiments of the present disclosure. As shown in FIG. 7, the semiconductor device 70 of the semiconductor device package 4 is bonded to the dielectric layer 30 with an adhesion layer 67, and electrically connected to the conductive traces 62 with bonding wires 69.

Figure 8:
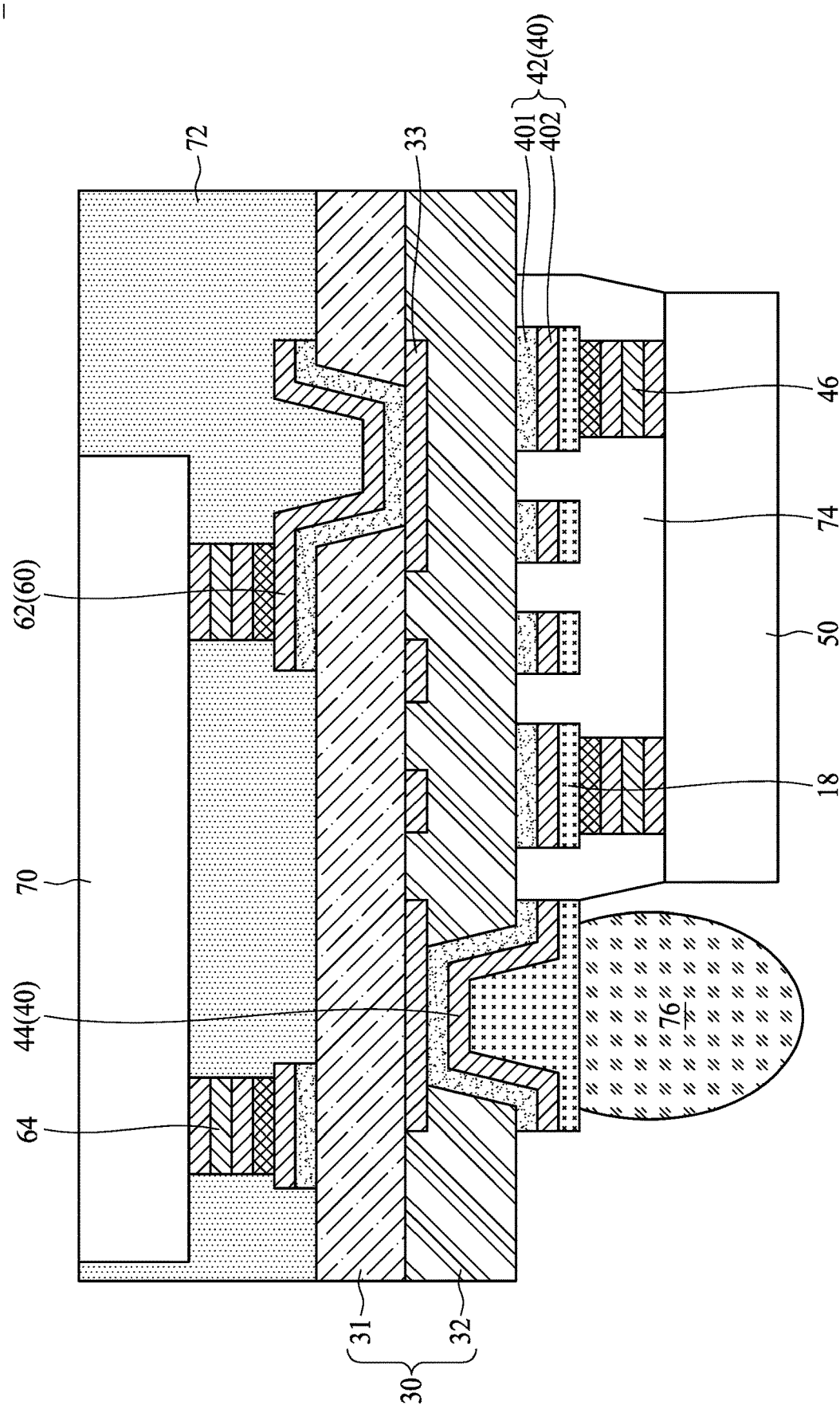
FIG. 8 is a schematic diagram illustrating a semiconductor device package 5 in accordance with some embodiments of the present disclosure.

FIG. 8 is a schematic diagram illustrating a semiconductor device package 5 in accordance with some embodiments of the present disclosure. As shown in FIG. 8, the dielectric layer 30 of the semiconductor device package 5 includes a multi-layered structure. For example, the dielectric layer 30 includes a first dielectric film 31 and a second dielectric film 32 stacked to each other. In some embodiments, an interconnection layer 33 is disposed between the first dielectric film 31 and the second dielectric film 32, and configured to electrically connect the conductive pattern 40 to the conductive pattern 60.

Figure 9:
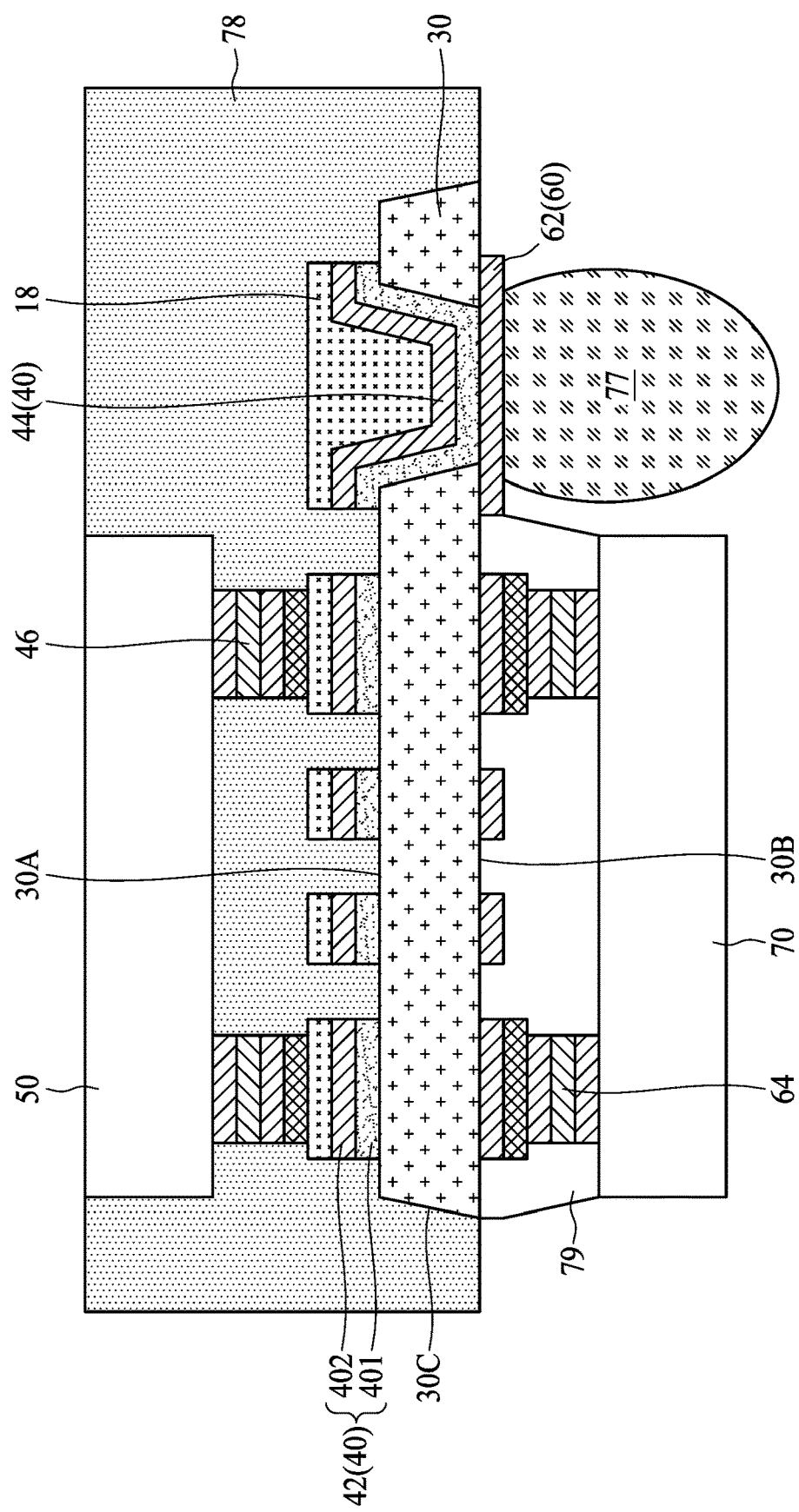
FIG. 9 is a schematic diagram illustrating a semiconductor device package 6 in accordance with some embodiments of the present disclosure.

FIG. 9 is a schematic diagram illustrating a semiconductor device package 6 in accordance with some embodiments of the present disclosure. As shown in FIG. 8, in contrast to the semiconductor device package 1, the connection element 77 of the semiconductor device package 6 is disposed on the second surface 30B of the dielectric layer 30, and electrically connected to the conductive pad 44 of the conductive pattern 40 through the conductive trace 62 of the conductive pattern 60.

Figure 10A:
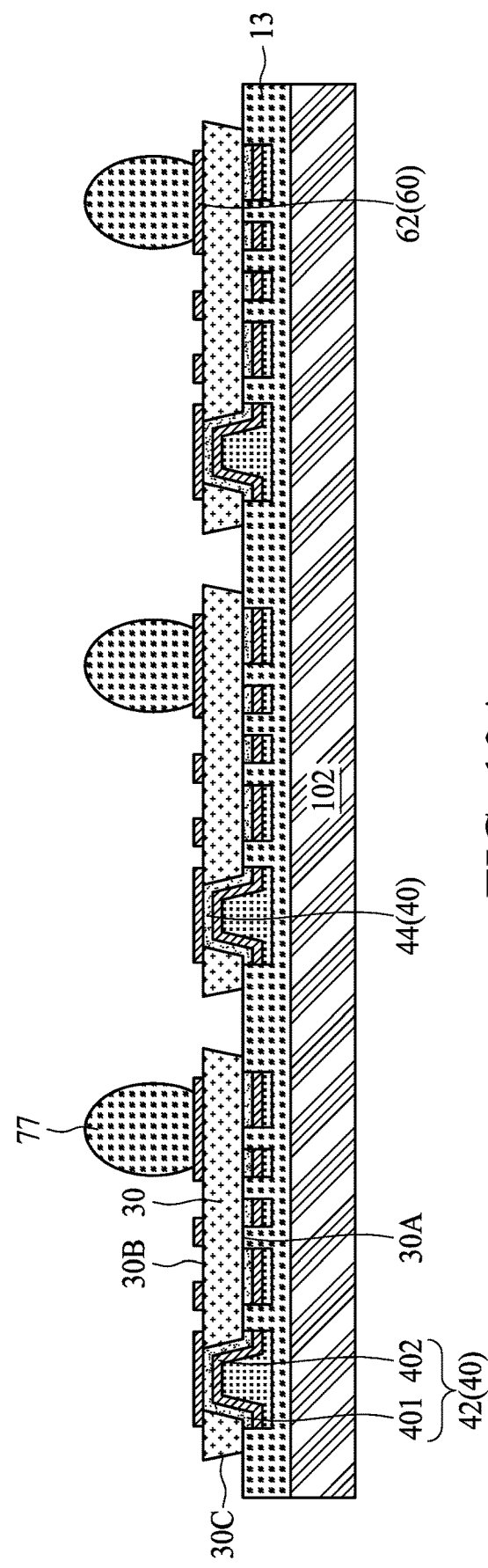
FIG. 10A, FIG. 10B, FIG. 10C and FIG. 10D are schematic diagrams illustrating various stages of a method of fabricating a semiconductor device package in accordance with some embodiments of the present disclosure.

FIG. 10A, FIG. 10B, FIG. 10C and FIG. 10D are schematic diagrams illustrating various stages of a method of fabricating a semiconductor device package in accordance with some embodiments of the present disclosure. The conductive pattern 40 and the conductive pattern 60 can be respectively formed on the first surface 30A and the second surface 30B of the dielectric layer 30 as illustrated in FIGS. 2A-2K. As shown in FIG. 10A, a plurality of connection elements 77 are formed on some of the conductive traces 62. The connection elements 77 may include conductive balls such as solder balls, conductive bumps such as solder bumps, conductive pillars or the like.

Figure 10B:
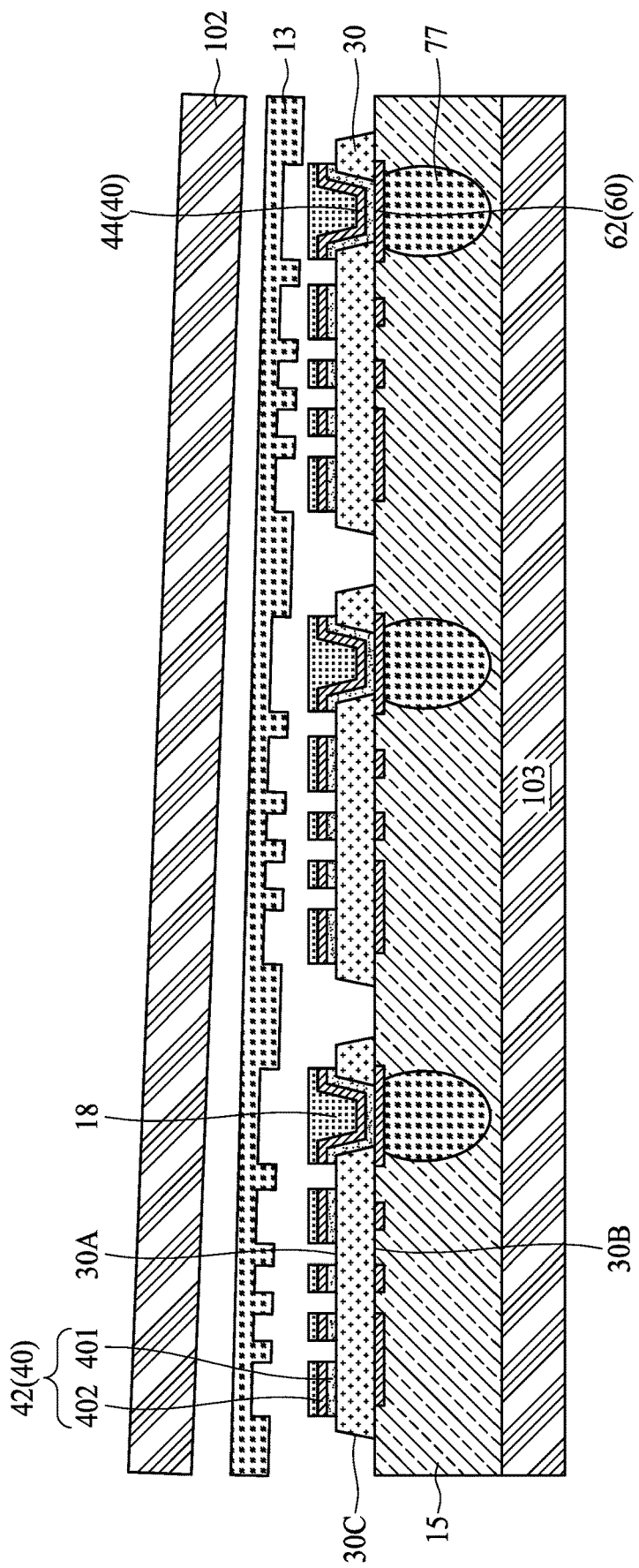

As shown in FIG. 10B, the second surface 30B of the dielectric layer 30 is bonded to a third carrier 103 with a glue layer 15. The glue layer 15 has a thickness larger than a height of the connection element 77 such that the connection element 77 is not damaged. The second carrier 102 and the releasing layer 13 are released from the first surface 30A of the dielectric layer 30.

Figure 10C:
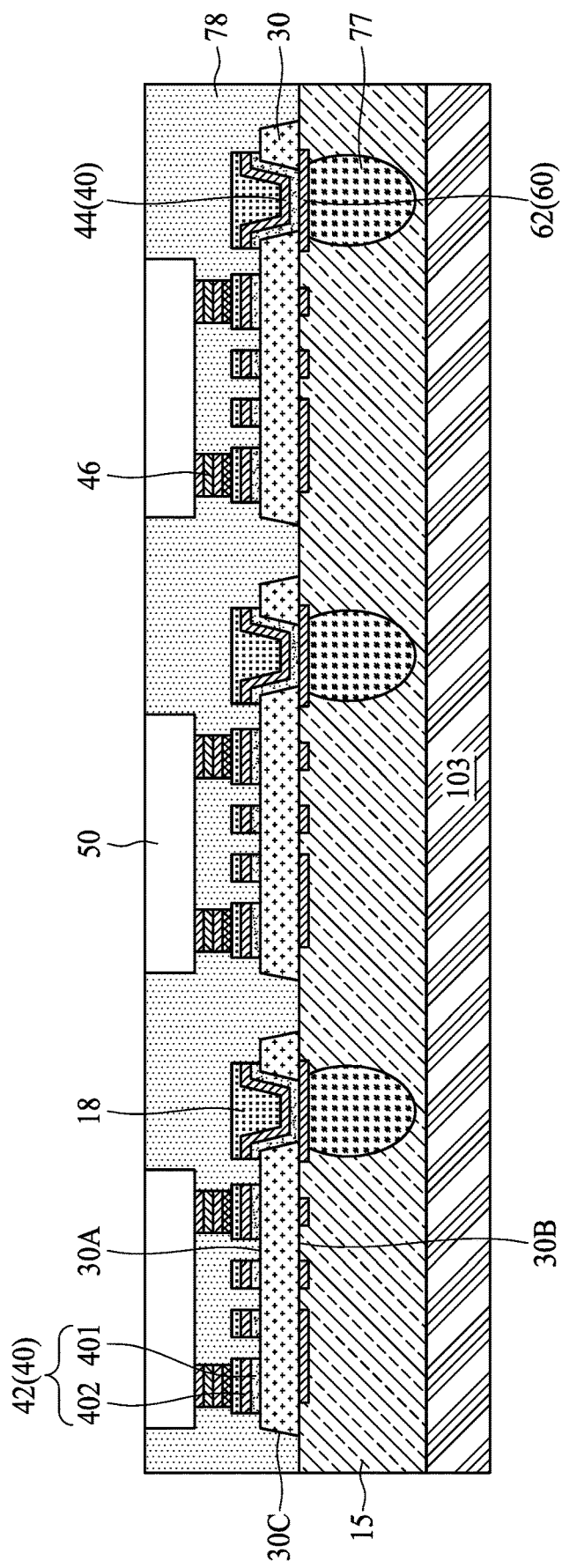

As shown in FIG. 10C, a plurality of semiconductor devices 50 are bonded to the conductive traces 42. In some embodiments, the semiconductor device 50 may be bonded to the conductive traces 42 through conductors 46 such as micro bumps or the like. The conductor 46 may be a multi-layered structure including a stack of multiple conductive materials. An encapsulation layer 78 is formed to encapsulate the semiconductor device 50. In some embodiments, the encapsulation layer 78 covers edges of the semiconductor device 50, and exposes an upper surface of the semiconductor device 50. The encapsulation layer 78 may also be interposed between the semiconductor devices 50 and the dielectric layer 30, serving as a molding underfill (MUF). Since the dielectric layer 30 is patterned, the encapsulation layer 78 may cover an edge of the dielectric layer 30, helping enhance robustness of the semiconductor device package. In some other embodiments, an underfill may be formed between the semiconductor devices 50 and the dielectric layer 30 prior to formation of the encapsulation layer 78.

Figure 10D:
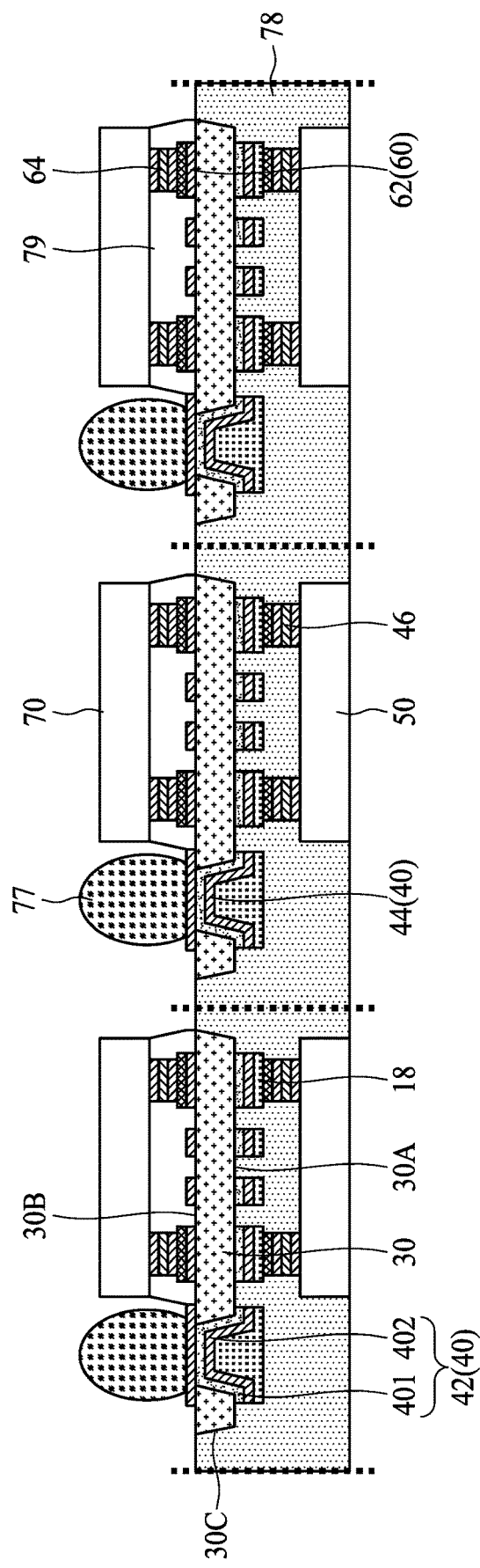

As shown in FIG. 10D, the third carrier 103 and the glue layer 15 are removed from the dielectric layer 30. A plurality of semiconductor devices 70 are bonded to the conductive traces 62 through conductors 64. In some embodiments, the conductors 64 may include micro bumps or the like. An underfill 79 is formed between the semiconductor devices 70 and the dielectric layer 30. A singulation process is performed to form a plurality of semiconductor devices 6 as illustrated in FIG. 9.

In some embodiments of the present disclosure, the semiconductor device package includes a thin dielectric layer with uniform surface(s) on which conductive patterns are formed. The dielectric layer with uniform surface increases the yield of formation of conductive traces with ultra-fine width, and thus semiconductor device package with high density I/O counts can be fulfilled. The thin dielectric layer and the conductive pattern with ultra-fine line width can also alleviate warpage of the semiconductor device package, and therefore improve the reliability of the semiconductor device package.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a dielectric layer having a first surface, wherein a surface uniformity of the first surface is substantially equal to or less than 5%;
   a first conductive pattern disposed on the first surface of the dielectric layer, wherein the first conductive pattern comprises a first conductive trace, and a line width of the first conductive trace substantially ranges from about 0.5 µm and about 2 µm; and
   a first semiconductor device disposed on the first surface of the dielectric layer and electrically connected to the first conductive pattern.

2. The semiconductor device package of claim 1, wherein a thickness of the dielectric layer is substantially equal to or less than about 5 µm.

3. The semiconductor device package of claim 1, further comprising a second conductive pattern disposed on a second surface of the dielectric layer and electrically connected to the first conductive pattern, wherein the second surface is opposite to the first surface.

4. The semiconductor device package of claim 3, wherein the second conductive pattern further comprises a second conductive trace, and a line width of the second conductive trace substantially ranges from about 0.5 µm and about 2 µm.

5. The semiconductor device package of claim 3, further comprising a second semiconductor device disposed on the second surface of the dielectric layer and electrically connected to the second conductive pattern.

6. The semiconductor device package of claim 5, further comprising an encapsulation layer encapsulating the second semiconductor device, and covering the second surface of the dielectric layer and an edge of the dielectric layer.

7. The semiconductor device package of claim 1, further comprising an underfill disposed between the first semiconductor device and the first surface of the dielectric layer.

8. The semiconductor device package of claim 1, further comprising a connection element disposed on the first surface of the dielectric layer and electrically connected to the first conductive pattern.

9. A semiconductor device package, comprising:
   a dielectric layer having a first surface, wherein the dielectric layer comprises a liquid-based dielectric material or a dry-film dielectric material, a thickness of the dielectric layer is substantially equal to or less than about 5 µm, and a surface uniformity of the first surface is substantially equal to or less than about 5%;
   a first conductive pattern disposed on the first surface of the dielectric layer, wherein the first conductive pattern comprises a first conductive trace, and a line width of the first conductive trace substantially ranges from about 0.5 µm and about 2 µm; and
   a first semiconductor device disposed on the first surface of the dielectric layer and electrically connected to the first conductive pattern.

10. The semiconductor device package of claim 9, further comprising a second conductive pattern disposed on a second surface of the dielectric layer and electrically connected to the first conductive pattern, wherein the second surface is opposite to the first surface.

11. The semiconductor device package of claim 10, wherein the second conductive pattern further comprises a second conductive trace, and a line width of the second conductive trace substantially ranges from about 0.5 μm and about 2 μm.

12. A semiconductor device package, comprising:
- a dielectric layer having a first surface and a second surface is opposite to the first surface, wherein a surface uniformity of the first surface is equal to or less than about 5%, wherein a surface uniformity of the second surface is equal to or less than about 5%;
- a first conductive pattern disposed on the first surface of the dielectric layer, wherein the first conductive pattern comprises a first conductive trace, and a line width of the first conductive trace is in a range from about 0.5 micrometers (μm) to about 2 μm; and
- a second conductive pattern disposed on the second surface of the dielectric layer, wherein the second conductive pattern comprises a second conductive trace, and a line width of the second conductive trace is in a range from about 0.5 μm to about 2 μm.

13. The semiconductor device package of claim 12, wherein a thickness of the dielectric layer is substantially equal to or less than about 5 μm.

14. The semiconductor device package of claim 12, further comprising a semiconductor device disposed on the first surface of the dielectric layer and electrically connected to the first conductive pattern.

15. The semiconductor device package of claim 12, further comprising a semiconductor device disposed on the second surface of the dielectric layer and electrically connected to the second conductive pattern.

16. The semiconductor device package of claim 12, wherein the first conductive pattern further comprises a conductive pad disposed on the first surface of the dielectric layer.

17. The semiconductor device package of claim 16, wherein the conductive pad extends through the dielectric layer, and is electrically connected to the second conductive trace disposed on the second surface of the dielectric layer.

18. The semiconductor device package of claim 17, further comprising a connection element disposed on the conductive pad.

19. The semiconductor device package of claim 17, further comprising a connection element disposed on the second conductive trace.

20. The semiconductor device package of claim 12, wherein the dielectric layer includes an inclined edge inclined outward with respect to the first surface, and the semiconductor device package further comprises an encapsulation layer covering the second surface and the inclined edge of the dielectric layer.

* * * * *